US012736573B2

(12) United States Patent
Suzuki et al.

(10) Patent No.: US 12,736,573 B2

(45) Date of Patent: Sep. 15, 2026

(54) INSPECTING DEVICE AND INSPECTING METHOD

(71) Applicant: Integral Geometry Science Inc., Hyogo (JP)

(72) Inventors: Shogo Suzuki, Hyogo (JP); Yutaro Nishimura, Hyogo (JP); Yuki Mima, Hyogo (JP); Kenjiro Kimura, Hyogo (JP); Noriaki Kimura, Hyogo (JP)

(73) Assignee: INTEGRAL GEOMETRY SCIENCE INC., Hyogo (JP)

( * ) Notice: Subject to any disclaimer, the term of this patent is extended or adjusted under 35 U.S.C. 154(b) by 410 days.

(21) Appl. No.: 18/279,512

(22) PCT Filed: Feb. 9, 2022

(86) PCT No.: PCT/JP2022/005169

§ 371 (c)(1), (2) Date: Aug. 30, 2023

(87) PCT Pub. No.: WO2022/190753

PCT Pub. Date: Sep. 15, 2022

(65) Prior Publication Data

US 2024/0302419 A1 Sep. 12, 2024

(30) Foreign Application Priority Data

Mar. 9, 2021 (JP) ................................ 2021-036846

(51) Int. Cl.
*G01R 29/12* (2006.01)

(52) U.S. Cl.
CPC .................................... *G01R 29/12* (2013.01)

(58) Field of Classification Search
CPC ........ G01Q 30/04; G01Q 60/50; G01R 29/12; G01R 29/14; G01R 33/10; G01R 29/08;
(Continued)

(56) References Cited

U.S. PATENT DOCUMENTS

| | | | |
|---|---|---|---|
| 6,144,206 | A | 11/2000 | Goldfine et al. |
| 6,611,142 | B1 | 8/2003 | Jones et al. |

(Continued)

FOREIGN PATENT DOCUMENTS

| | | | |
|---|---|---|---|
| EP | 1615041 A1 * | 1/2006 | ............. G01R 29/08 |
| JP | 2001-508178 | 6/2001 | |

(Continued)

OTHER PUBLICATIONS

Y. Mima, K. Kimura, T. Inao, N. Oyabu and N. Kimura, "Failure analysis of electric circuit board by high resolution magnetic field microscopy," 2013 3rd IEEE CPMT Symposium Japan, Kyoto, Japan, 2013, pp. 1-4, doi: 10.1109/ICSJ.2013.6756129. (Year: 2013).*

(Continued)

*Primary Examiner* — Catherine T. Rastovski
*Assistant Examiner* — Eric Sebastian Von Wald
(74) *Attorney, Agent, or Firm* — Wenderoth, Lind & Ponack, L.L.P.

(57) ABSTRACT

The inspecting device is an inspecting device that generates a spatial distribution image of an electric field, the inspecting device including: an electric field obtainer that measures the spatial distribution of the electric field at at least one measurement position determined relative to a scanning position, outside an object that emits the electric field; a scanner, by scanning the electric field obtainer, that obtains a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated.

13 Claims, 20 Drawing Sheets

(58) Field of Classification Search

CPC ...... G01R 31/58; G01R 23/165; G01R 33/12; G01R 29/0878; G01R 33/02; G01V 3/088; G01V 3/08; G06F 17/13; G06T 7/0006; G06T 7/62; H01J 2237/2007; H01J 2237/221; H01J 2237/2446; H01J 2237/24495; H01J 2237/2815; H01J 37/20

See application file for complete search history.

(56) References Cited

U.S. PATENT DOCUMENTS

| | | | | |
|---|---|---|---|---|
| 9,568,567 | B2 * | 2/2017 | Kimura | G06F 17/13 |
| 10,725,078 | B2 * | 7/2020 | Aberbour | G01R 29/0878 |
| 2003/0080744 | A1 | 5/2003 | Goldfine et al. | |
| 2004/0130341 | A1 | 7/2004 | Kawanishi et al. | |
| 2005/0127890 | A1 * | 6/2005 | Swenson | G01R 29/12 324/72 |
| 2010/0219819 | A1 | 9/2010 | Kimura et al. | |
| 2012/0330581 | A1 | 12/2012 | Kimura | |
| 2014/0081584 | A1 | 3/2014 | Kimura | |
| 2016/0154042 | A1 | 6/2016 | Kikunaga et al. | |
| 2018/0238948 | A1 * | 8/2018 | Hisatake | G01R 29/0885 |
| 2019/0146042 | A1 * | 5/2019 | Israelowitz | G01R 33/1269 324/252 |
| 2020/0057101 | A1 * | 2/2020 | Shumaker | G01R 29/0878 |
| 2020/0209171 | A1 * | 7/2020 | Abou-Khousa | G01R 33/34 |
| 2021/0048465 | A1 * | 2/2021 | Anderson | G01R 29/0878 |
| 2021/0082661 | A1 * | 3/2021 | Bloom | H04N 23/75 |

FOREIGN PATENT DOCUMENTS

| | | | |
|---|---|---|---|
| JP | 2001-521618 | 11/2001 | |
| JP | 2016-133410 | 7/2016 | |
| KR | 20160114636 A * | 10/2016 | G01R 31/00 |
| WO | 98/30921 | 7/1998 | |
| WO | 2008/123432 | 10/2008 | |
| WO | 2011/108543 | 9/2011 | |

OTHER PUBLICATIONS

Extended European Search Report issued Dec. 19, 2024 in corresponding European Patent Application No. 22766718.5.

International Search Report (ISR) issued on Mar. 29, 2022 in International (PCT) Application No. PCT/JP2022/005169.

Office Action issued Mar. 14, 2026 in corresponding Chinese Patent Application No. 202280016856.0, with partial English translation.

* cited by examiner

Database
106
Display monitor
107
108
109
110
111
135
y
x
z
Ei (x, y, z = 0)
Ei (x, y, z = $z_a$)
Control device
101
Computer
102
Outputter
103
Each-unit controller
104
Data recorder
105
112
119
116
118
117
113
100
114
115
Reconstruction

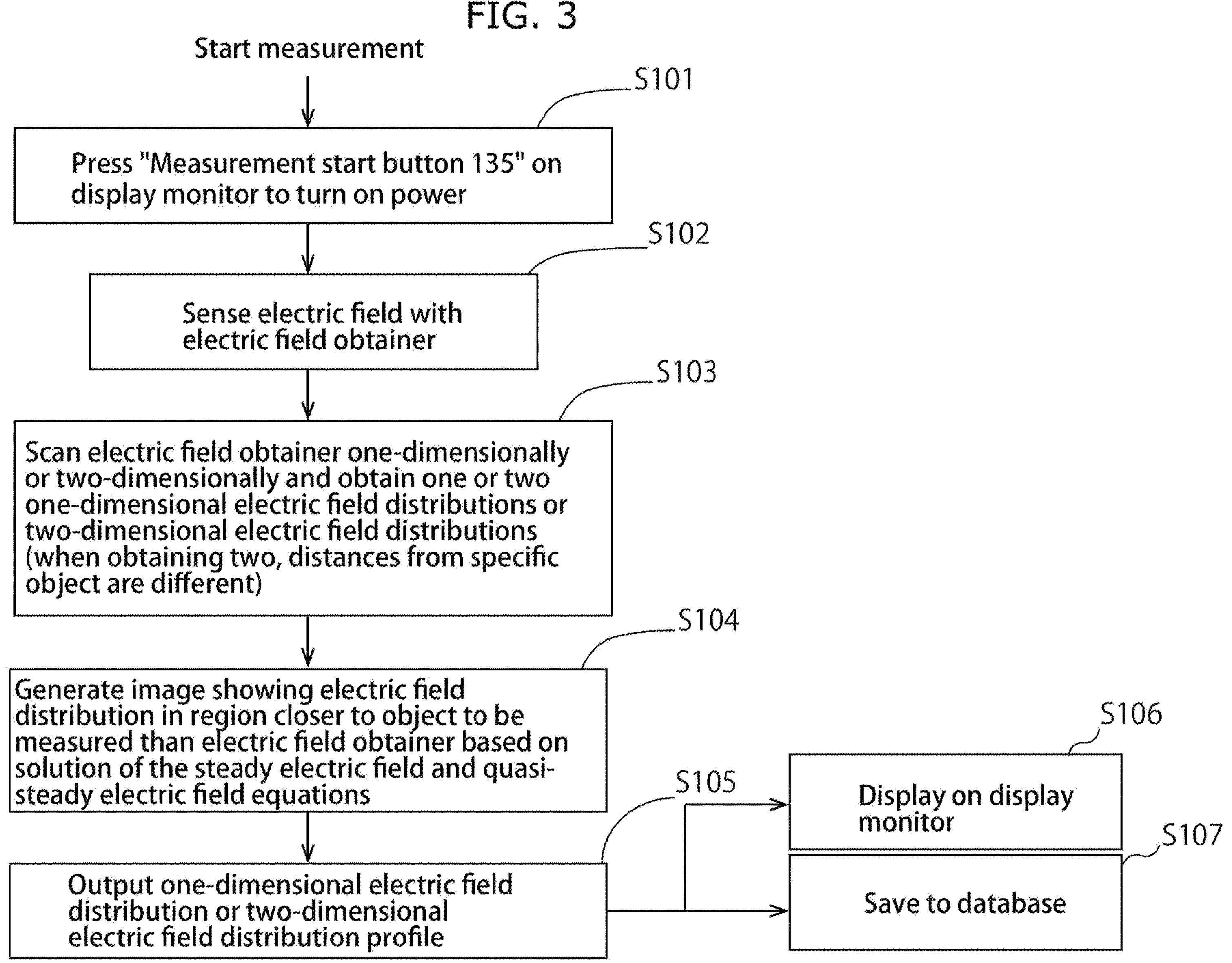
FIG. 3
Start measurement
S101
Press "Measurement start button 135" on display monitor to turn on power
S102
Sense electric field with electric field obtainer
S103
Scan electric field obtainer one-dimensionally or two-dimensionally and obtain one or two one-dimensional electric field distributions or two-dimensional electric field distributions (when obtaining two, distances from specific object are different)
S104
Generate image showing electric field distribution in region closer to object to be measured than electric field obtainer based on solution of the steady electric field and quasi-steady electric field equations
S105
Output one-dimensional electric field distribution or two-dimensional electric field distribution profile
S106
Display on display monitor
S107
Save to database 124
127
121
123
LPF
122
126
Preamp
120

FIG. 8 y
x
z
114
Ei (x, y, z = 0)
Ei (x, y, z = d)
128
115
Ei (x, y, z = $z_a$)
118
113
Reconstruction
117

FIG. 9 x
y
z
114
Ei (x, y, z = 0)
115
Ei (x, y, z = $z_a$)
113
118
117
Reconstruction

112
Scan
118
117
x
z
y
Ei (x, y, z_a)
Ei (x, y, 0)
113

Ei (x, y, d)
Second measurement surface 128
Scan
112
118
117
x
z
y
Ei (x, y, z_a)
Ei (x, y, 0)
113

Scan

Ei (y, d)
118
112
x
z
y
Ei (y, $z_0$)
Scan
113
Ei (y, 0)

Scan $E_i\,(y, z_a)$

113

$E_i\,(y, 0)$

130

Spatial coordinate recognition device 107
112
118
117
116
113
Ei (x, y, 0)
Ei (x, y, $z_a$)
x
y
z

FIG. 20

INSPECTING DEVICE AND INSPECTING METHOD

TECHNICAL FIELD

The present disclosure relates to an inspecting device and an inspecting method for visualizing electrical wiring in a non-contact manner.

BACKGROUND ART

Conventionally, in the electric wiring inspection, the presence or absence of continuity due to energization is inspected. The technology described in Patent Literature (PTL) 1 relates to such electrical wiring inspection. Specifically, in PTL 1, normal conduction of electrical wiring is inspected based on energization determination obtained by controlling voltage applying portions based on inter-terminal connection information.

CITATION LIST

Patent Literature

[PTL 1] Japanese Unexamined Patent Application Publication No. 2016-133410

SUMMARY OF INVENTION

Technical Problem

However, in real complicatedly tangled wiring, it may be difficult to distinguish conducting between wiring and non-conducting wiring in a complicated wiring network based only on the information on which wiring are conducting in the energization determination. Therefore, the present disclosure provides an inspecting device and an inspecting method that can extract specific wiring in a complicatedly tangled wiring network based on the measurement results of one or more electric field sensors located across a gap from the wiring network.

Solution to Problem

For example, an inspection device according to an aspect of the present disclosure is an inspecting device that generates a spatial distribution image of an electric field, the inspecting device including: an electric field obtainer that measures the spatial distribution of the electric field at at least one measurement position determined relative to a scanning position, outside an object that emits the electric field; a scanner that obtains, by scanning the electric field obtainer, a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated.

In addition, for example, the inspecting system according to an aspect of the present disclosure is an inspecting system that extracts wiring to which a voltage is applied in a wiring network by one-dimensionally or two-dimensionally arranging one or two or more single electric field sensors to obtain an electric field distribution, wherein the inspecting system includes an electric field obtainer in which single electric field sensors are arranged one-dimensionally or two-dimensionally; a scanner that scans the electric field obtainer; a position measurer that measures a distance between the electric field obtainer and an object to be measured; a data recorder that obtains the electric field distribution at each spatial coordinate as it scans and saves it as data; a computer that analyzes the basic equation of the electric field based on the recorded data and outputs the electric field distribution inside and outside the wiring network; an outputter that displays the output results; a display that displays the output results; a database on a cloud that stores the measured results; and an each-unit controller that controls each of these units.

It should be noted that these generic or specific aspects may be realized by a system, device, method, integrated circuit, computer program, or non-transitory recording medium such as a computer-readable CD-ROM, or any combination of systems, devices, methods, integrated circuits, computer programs, and recording media.

Advantageous Effects of Invention

According to one aspect of the present disclosure, it is possible to measure the electric field distribution in a non-contact manner in a region away from the wiring network and accurately identify a specific wiring in the wiring network.

BRIEF DESCRIPTION OF DRAWINGS

FIG. 3 is a flowchart showing the operation of the inspecting system according to the embodiment.

FIG. 8 is a conceptual diagram showing Example 1 of reconstruction according to the embodiment.

FIG. 9 is a conceptual diagram showing Example 2 of reconstruction according to the embodiment.

FIG. 14 is a conceptual diagram showing Example 7 of reconstruction according to the embodiment;

FIG. 15 is a conceptual diagram showing Example 8 of reconstruction according to the embodiment.

FIG. 16 is a conceptual diagram showing Example 9 of reconstruction according to the embodiment;

FIG. 20 is a conceptual diagram showing an example of displaying the data accumulated in the database on the map of the region where the inspection was performed according to the embodiment.

DESCRIPTION OF EMBODIMENTS

Figure 1:
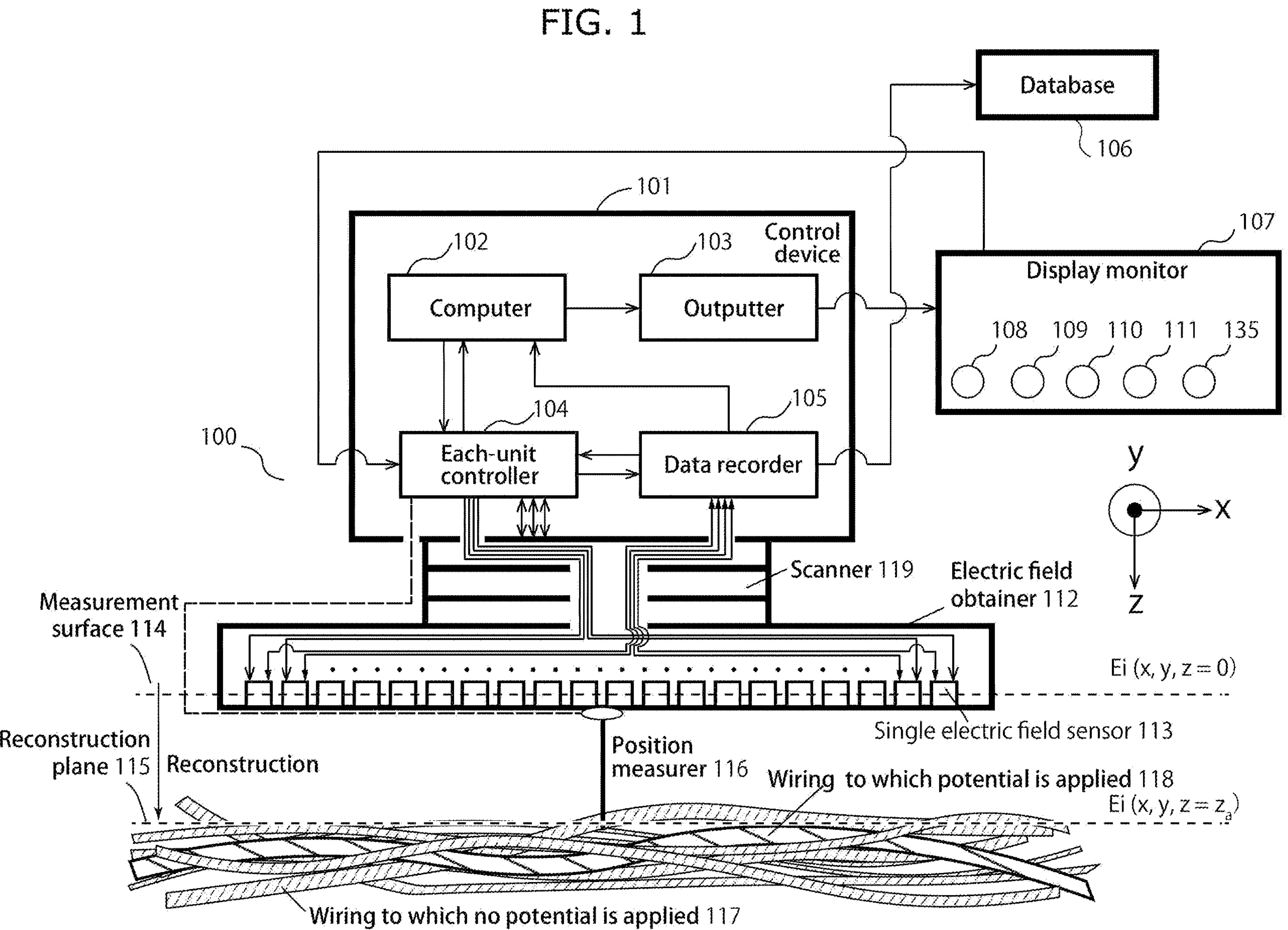
FIG. 1 is a conceptual diagram showing a configuration of an inspecting system according to an embodiment.

In general, it is determined whether a specific wiring in a complicated wiring network is energized by using a voltage control device that controls the on/off of voltage application to the wiring, and the energization is checked by monitoring the current flowing through the wiring. However, it is common practice to bring a single electric field sensor closer to the wiring network to check which wiring in the wiring network is receiving the voltage when the voltage is applied, but for a complicated wiring network, even if the single electric field sensor is brought closer to the wiring network, it is difficult to identify the wiring to which the voltage is actually applied.

Thus, for example, an inspection device according to an aspect of the present disclosure is an inspecting device that generates a spatial distribution image of an electric field, the inspecting device including: an electric field obtainer that measures the spatial distribution of the electric field at at least one measurement position determined relative to a scanning position, outside an object that emits the electric field; a scanner that obtains, by scanning the electric field obtainer, a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated.

Accordingly, the inspecting device can measure the spatial distribution of the electric field in a region distant from the object, and appropriately indicate the spatial distribution of the electric field in a region closer to the object than the measurement position. Therefore, for example, it is possible to measure the electric field distribution from a region away from the wiring network in a non-contact manner and to accurately identify a specific wiring in the wiring network.

In addition, for example, the inspecting system according to an aspect of the present disclosure is an inspecting system that extracts a specific wiring in a wiring network by one-dimensionally or two-dimensionally arranging one or a plurality of single electric field sensors to obtain an electric field distribution, wherein the inspecting system includes an electric field obtainer in which single electric field sensors are arranged one-dimensionally or two-dimensionally; a scanner that scans the electric field obtainer; a position measurer that measures a distance between the electric field obtainer and an object to be measured; a data recorder that obtains the electric field distribution at each spatial coordinate as it scans and saves it as data; a computer that analyzes the basic equation of the electric field based on the recorded data and outputs the electric field distribution inside and outside the wiring network; an outputter that displays the output results; a display that displays the output results; a database on a cloud that stores the measured results; and an each-unit controller that controls each of these units.

Accordingly, the inspecting system can identify and extract the voltage-applied wiring included in the wiring network according to the data or the image showing the electric field in the region closer to the wiring network than the electric field obtainer. This data or image is assumed to indicate with high accuracy the position of the wiring where the voltage is applied.

In addition, for example, the electric field obtainer includes a two-dimensional single electric field sensor array arranged two-dimensionally in a two-dimensional plane set in a space surrounding the wiring network to be measured.

Accordingly, the inspecting system can sufficiently obtain the spatial change of the electric field with a two-dimensional single electric field sensor array. Therefore, the inspecting system can adequately generate an image showing the electric field.

In addition, for example, the single electric field sensor array includes a one-dimensional single electric field sensor array set on a one-dimensional straight line set in the space surrounding the wiring network to be measured.

Accordingly, the inspecting system can appropriately inspect the voltage-applied wiring buried in the wiring network with few resources and at low cost.

In addition, for example, the electric field obtainer senses the electric field with two layers of two-dimensional single electric field sensor arrays arranged in two two-dimensional planes in two two-dimensional planes set in the space surrounding the wiring network to be measured.

Accordingly, the inspecting system can appropriately obtain the gradient of the electric field in the up-down direction, and can appropriately generate an image showing the electric field.

In addition, for example, the information processing circuit generates the image according to Equation (5), which will be described later, as an arithmetic expression according to the sensing result and the basic equations, and in the arithmetic expression, $E_i(x, y, z)$ denotes i component of the electric field at coordinate position (x, y, z); i denotes x, y, or z; z denotes a coordinate value of z in the case where, out of one-dimensional or two-dimensional region or two parallel two-dimensional regions where the electric field is measured, "the normal direction intersecting with the wiring network region in the case of a one-dimensional region", "the normal direction in the case of a two-dimensional region", or "the normal direction in the case of two parallel two-dimensional regions" is taken as the z-direction; x denotes a coordinate value in x-direction orthogonal to the z-direction; y denotes a coordinate value in y-direction orthogonal to the z-direction and the x-direction; $f(k_x, k_y)$ denotes a two-dimensional Fourier transform image of $E_i(x, y, 0)$ showing the sensing result at (x, y, 0) which is a measurement surface; $k_x$ denotes a wave number with respect to x; and $k_y$ denotes a wave number with respect to y.

Accordingly, the inspecting system can use the measurement results to properly generate an image showing the electric field in a region closer to the wiring network than a single electric field sensor.

In addition, for example, the calculator generates the image according to Equation (9), which will be described later, as an arithmetic expression according to the measurement result and the basic equations, and in the arithmetic expression, $E_i(x, y, z)$ denotes i component of the electric field at coordinate position (x, y, z); i denotes x, y, or z; x denotes a coordinate value in x-direction orthogonal to the z-direction; y denotes a coordinate value in y-direction orthogonal to the z-direction and the x-direction; z denotes a coordinate value of z in the case where, out of one-dimensional or two-dimensional region or two parallel two-dimensional regions where the electric field is measured, "the normal direction intersecting with the wiring network region in the case of a one-dimensional region", "the normal direction in the case of a two-dimensional region", or "the normal direction in the case of two parallel two-dimensional regions" is taken as the z-direction; $f(k_x, k_y)$ denotes a two-dimensional Fourier transform image of $E_i(x, y, 0)$ showing the measurement result at (x, y, 0) which is a measurement surface; $g(k_x, k_y)$ denotes a two-dimensional Fourier transform image of $\partial/\partial z E_i(x, y, z)|_{z=0}$ showing a gradient in z-direction of the measurement result at (x, y, 0) which is the measurement surface; $k_x$ denotes a wave number with respect to x; and $k_y$ denotes a wave number with respect to y.

Accordingly, the inspecting system can use the measurement result and its gradient to appropriately generate an image showing the electric field in the region closer to the wiring network than the electric field obtainer.

Embodiments will be described below with reference to the drawings. It should be noted that all of the embodiments described below show comprehensive or specific examples. Numerical values, shapes, materials, components, arrangement positions and connection forms of components, steps, order of steps, and the like shown in the following embodiments are examples, and are not intended to limit the scope of the claims.

In addition, the electric field component in the description here is the component that constitutes the electric field. The electric field component may be each of a plurality of electric fields superimposed on the overall electric field. In addition, the devices described here may include a plurality of components arranged in a distributed manner.

Embodiment

FIG. 1 is a conceptual diagram showing the configuration of an inspecting system (inspecting device) 100 according to the present embodiment. Inspecting system 100 shown in FIG. 1 is a system for inspecting an electric field applied to wiring. The complicatedly tangled wiring shown in the lower part of FIG. 1 includes wiring 117 to which no voltage (potential) is applied and wiring 118 to which a voltage (potential) is applied.

The purpose of inspecting system 100 is to identify wiring 118 to which the voltage is applied from this complicatedly tangled wiring. When the electric field obtainer (electric field sensor unit) 112 in inspecting system 100 is brought close to the complicatedly tangled wiring, the signal of position measurer 116 which is a part of the configuration of inspecting system 100 changes. The signal output from position measurer 116 and the distance from electric field obtainer 112 are in one-to-one correspondence. The signal output is sent to each-unit controller 104 which is a part of the configuration of inspecting system 100, converted into distance data, and sent to computer (calculator) 102. Position measurer 116 may be a laser displacement meter that measures distance using laser interference, or an electric capacity displacement meter that measures distance using changes in electric capacitance. Alternatively, it may be a contact switch that outputs a signal upon contact. Electric field obtainer 112 located at a predetermined position by position measurer 116 measures the spatial distribution of the electric field generated by wiring 118 to which the voltage is applied, which is the object to be measured. Electric field obtainer 112 includes single electric field sensor 113.

Single electric field sensor 113 outputs a signal corresponding to the intensity, direction, and phase of the electric field that has been applied. Single electric field sensor 113 may be a metal structure, a metal ball, a metal plate, or a metal needle that outputs a signal according to the intensity, direction, and phase of the electric field, or may be a metal structure which is electrically connected to the gate electrode of the field effect transistor and in which the source and drain currents of the field effect transistor change depending on the intensity, direction, and phase of the electric field. In addition, single electric field sensor 113 may be an optical electric field sensor in which the plane of polarization of light changes according to the intensity, direction, and phase of the electric field, or a laser measuring sensor which measures a state of energy splitting that has been changed according to the intensity, direction, and phase of the electric field, that is, a state of energy splitting caused by the Stark effect. Alternatively, it may be single electric field sensor 113 that utilizes the effect of changing the trajectory of charged particles in vacuum according to the intensity, direction, and phase of the electric field.

(Two-Dimensional Sensor and Two-Dimensional Measurement)

Single electric field sensor 113 may be arranged two-dimensionally within electric field obtainer 112 in measurement surface 114 located within the two-dimensional plane set within the space surrounding the measurement object. In this case, the electric field distribution near wiring 118 to which the voltage is applied is calculated by computer 102 using Equation (5) described later.

Figure 8:
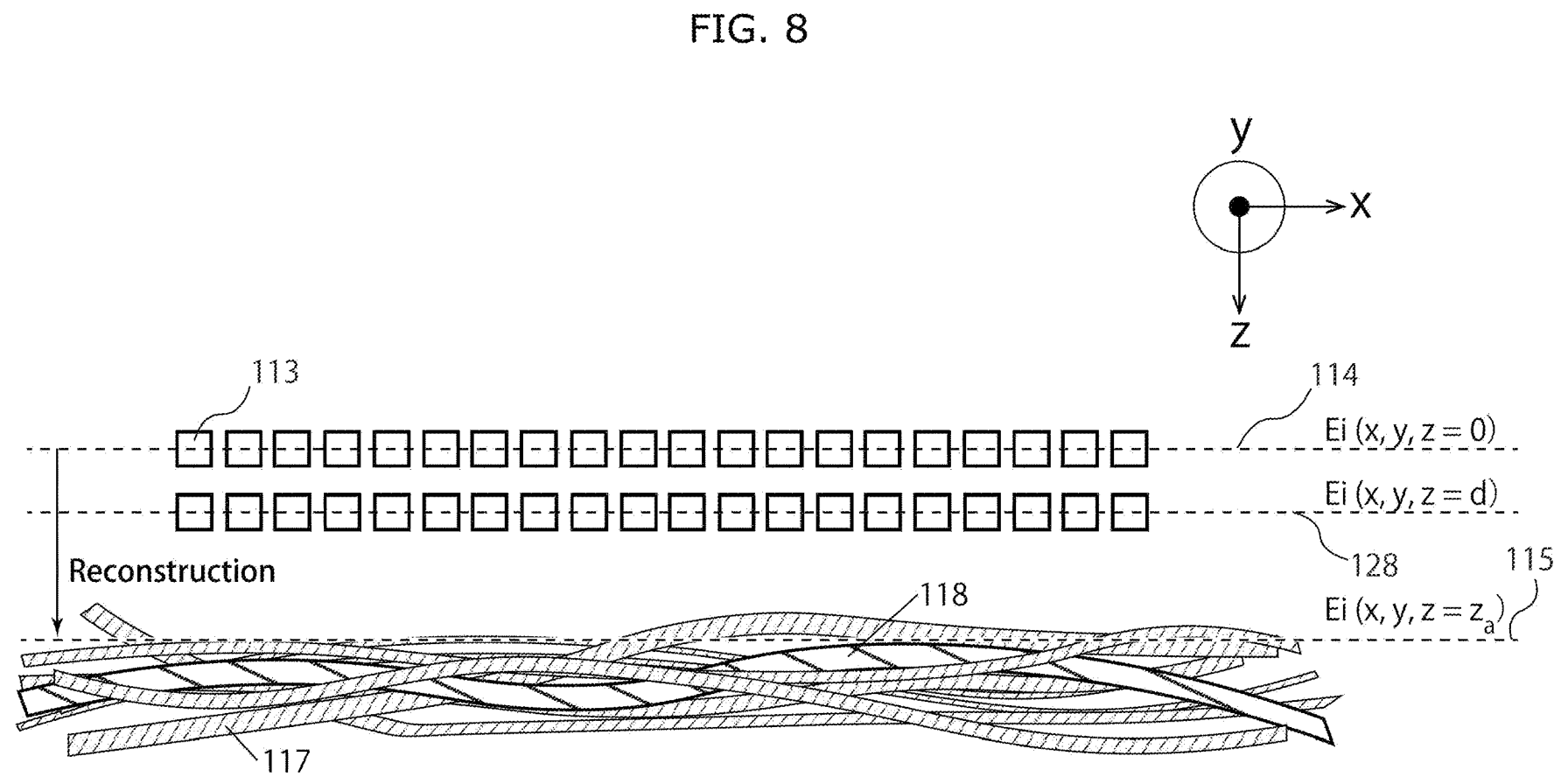

In addition, two-dimensionally arranged single electric field sensors 113 may be arranged in two stages at different positions in the normal direction of the two-dimensional plane so that the electric field distribution may be obtained on measurement surface 114 and second measurement surface 128, which are different positions in the normal direction as shown in FIG. 8. In this case, the electric field distribution near wiring 118 to which the voltage is applied is calculated by computer 102 using Equation (9) described later.

In this case, first-stage single electric field sensor 113 and second-stage single electric field sensor 113 may be arranged alternately so that first-stage single electric field sensor 113 is not in the shadow of second-stage single electric field sensor 113 when viewed from the object to be measured. When electric field obtainer 112 including two-dimensionally arranged single electric field sensors 113 is used, one or two two-dimensional electric field distributions are measured, and the results are sent to data recorder 105. In order to obtain data with higher resolution, electric field obtainer 112 may be mechanically scanned (moved) by scanner 119 to obtain data at different positions on measurement surface 114 and interpolate the data. This makes it possible to obtain an electric field distribution with higher resolution.

(One-Dimensional Sensor and Two-Dimensional Measurement)

In addition, in electric field obtainer 112, single electric field sensors 113 may arranged one-dimensionally within measurement surface 114 in the two-dimensional plane set in the space surrounding the object to be measured. In this case, the direction in which single electric field sensors 113 are arranged is preferably parallel or orthogonal to wiring 118 to which the voltage is applied. In order to obtain the two-dimensional electric field distribution, electric field obtainer 112 including single electric field sensors 113 arranged one-dimensionally may be one-dimensionally scanned by scanner 119 in a direction orthogonal to the array direction to obtain the two-dimensional electric field distribution. In this case, the electric field distribution near wiring 118 to which the voltage is applied is calculated by computer 102 using Equation (5) described later. In this case, in order to obtain data with higher resolution, scanning may be performed in a direction orthogonal to the array direction while scanning in the array direction, or scanning may be performed alternately.

In addition, scanner 119 may change the distance between measurement surface 114 and the object to be measured, repeat the above scanning, and obtain two two-dimensional electric field distributions. In this case, the electric field distribution near wiring 118 to which the voltage is applied is calculated by computer 102 using Equation (9) described later. By performing the reconstruction shown in FIG. 8 using two two-dimensional electric field distributions, it is possible to remove noise and more accurately identify wiring 118 to which the voltage is applied.

(1D Sensor and 1D Measurement)

In addition, using the data of the one-dimensional electric field distribution obtained by electric field obtainer 112 in which single electric field sensors 113 are arranged one-dimensionally, wiring 118 to which the voltage is applied may be identified by computer 102. However, in this case, it is desirable that the array direction of single electric field sensors 113 is orthogonal to the direction of wiring 118 to which the voltage is applied. In this case, the electric field distribution near wiring 118 to which the voltage is applied is calculated by computer 102 using Equation (5a) described later.

In addition, in order to identify the wiring more accurately, one-dimensional electric field distribution data may be obtained by changing the position of electric field obtainer 112 including one-dimensionally arranged electric field sensors in the direction of the normal to the one-dimensional array direction of single electric field sensors 113 that crosses wiring 118 to which the voltage is applied.

In this case, the electric field distribution near wiring 118 to which the voltage is applied is calculated by computer 102 using Equation (9a) described later. Accordingly, electric field noise can be removed and the wiring can be identified accurately. The one-dimensional array of single electric field sensors 113 can realize cost reduction compared to the two-dimensional array of single electric field sensors 113.

(One Sensor and Two-Dimensional Measurement)

In addition, electric field obtainer 112 may include one single electric field sensor 113. This makes it possible to realize cost reduction compared to the one-dimensional arrangement of single electric field sensors 113 and the two-dimensional arrangement of single electric field sensors 113. Electric field obtainer 112 including one single electric field sensor 113 may scan two-dimensionally on measurement surface 114 in a plane parallel to wiring 118 to which a voltage is applied by scanner 119 to obtain a two-dimensional electric field distribution. In this case, the electric field distribution near wiring 118 to which the voltage is applied is calculated by computer 102 using Equation (5) described later. This makes it possible to realize cost reduction compared to inspecting system 100 including electric field obtainer 112 including the array of single electric field sensors 113 two-dimensionally.

In addition, in order to remove electric field noise, two-dimensional scanning is performed within measurement surface 114 parallel to wiring 118 to which a voltage is applied; after obtaining the two-dimensional electric field distribution, the position in the normal direction of measurement surface 114 is changed and single electric field sensors 113 scan two-dimensionally again by scanner 119 to obtain two different two-dimensional electric field distributions; and using these two two-dimensional electric field distributions, an electric field distribution near wiring 118 to which voltage is applied may be calculated by computer 102. In this case, the electric field distribution near wiring 118 to which the voltage is applied is calculated by computer 102 using Equation (9) described later.

(One Sensor and One-Dimensional Measurement)

Figure 2:
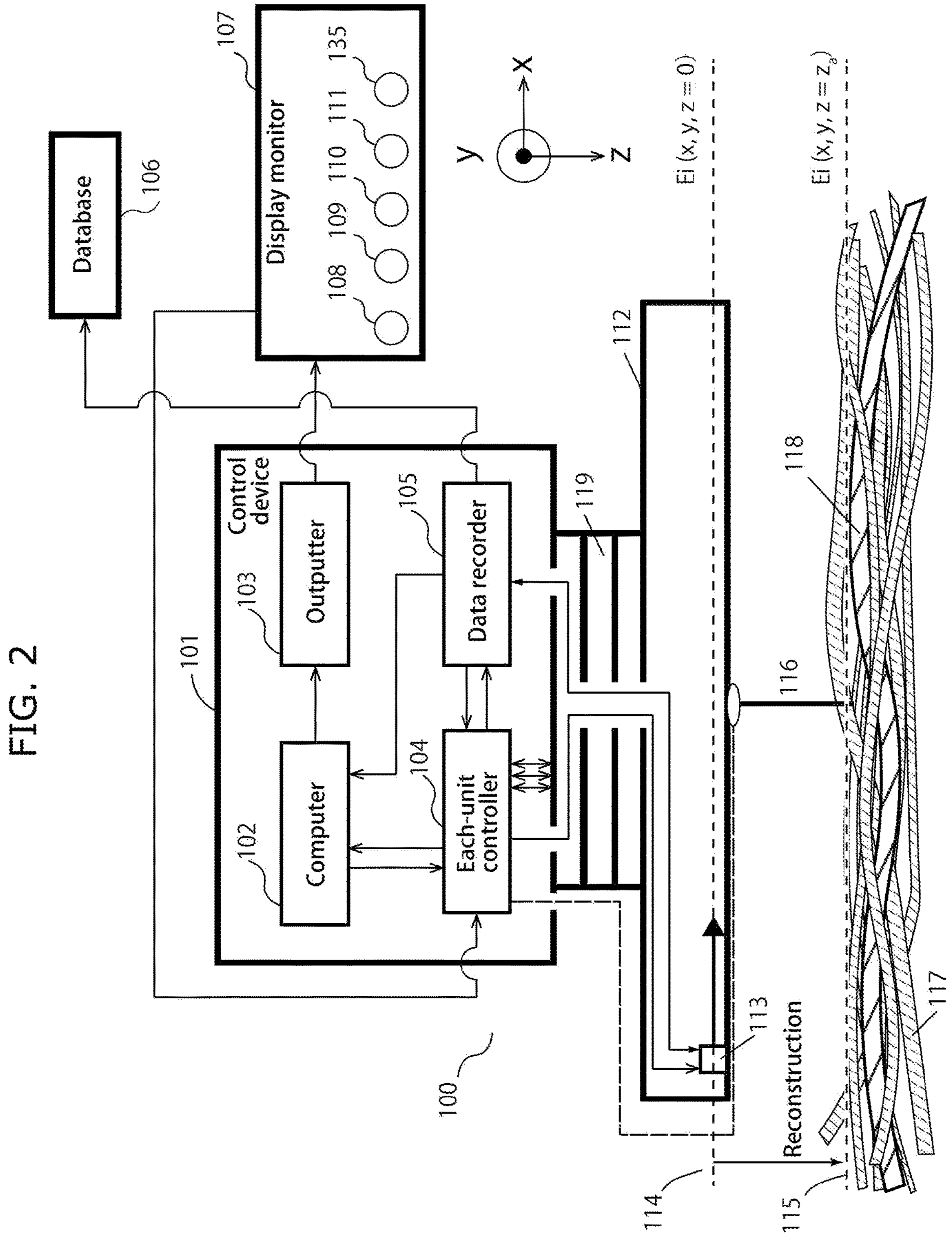
FIG. 2 is a conceptual diagram showing another configuration of the inspecting system according to the embodiment.

In addition, as shown in FIG. 2, electric field obtainer 112 may include one single electric field sensor 113. This makes it possible to realize cost reduction compared to the one-dimensional arrangement of single electric field sensors 113 and the two-dimensional arrangement of single electric field sensors 113. Electric field obtainer 112 including one single electric field sensor 113 may scan one-dimensionally in the direction orthogonal to wiring 118 to which the voltage is applied by scanner 119 to obtain the one-dimensional electric field distribution and the reconstruction shown in FIG. 14, FIG. 16, or FIG. 17 may be performed. In this case, the electric field distribution near wiring 118 to which the voltage is applied is calculated by computer 102 using Equation (5a) described later. This makes it possible to realize cost reduction compared to inspecting system 100 including electric field obtainer 112 including the array of single electric field sensors 113 two-dimensionally.

In addition, in order to remove electric field noise, one-dimensional scanning is performed in the direction orthogonal to wiring 118 to which the voltage is applied; after obtaining the one-dimensional electric field distribution, the position in the direction normal to the scanning direction, which intersects with wiring 118 to which the voltage is applied, is changed and single electric field sensors 113 scan one-dimensionally again by scanner 119 to obtain two different one-dimensional electric field distributions; and using these two one-dimensional electric field distributions, the calculation may be performed by computer 102. In this case, the electric field distribution near wiring 118 to which the voltage is applied is calculated by computer 102 using Equation (9a) described later.

(Processing Flow)

FIG. 3 is a flow chart showing the operation of inspecting system 100 shown in FIG. 1. First, in inspecting system 100, after measurement start button 135 on display monitor 107, which is a touch panel, is pressed, measurement is started (S101), and an electric field is sensed by electric field obtainer 112 (S102). For example, when measurement start button 135 is pressed, electric field obtainer 112 and the like may be powered on. Electric field obtainer 112 is one-dimensionally scanned or two-dimensionally scanned by scanner 119, or this operation is repeated again on measurement surface 114 at a different position to obtain one or two one-dimensional electric field distributions or two-dimensional electric field distributions (S103).

These data are sent to and recorded in data recorder 105, and in computer 102, based on the solution of the steady electric field or quasi-steady electric field equation, a one-dimensional or two-dimensional electric field distribution at a location closer to wiring 118 to which the voltage is applied, which is the object to be measured, than electric field obtainer 112 is calculated (S104). At that time, the distance between measurement surface 114 and the object to be measured obtained by position measurer 116 may be used as the distance between the one-dimensional or two-dimensional electric field distribution obtained by calculation and measurement surface 114. In addition, an image showing a one-dimensional or two-dimensional electric field distribution may be generated as a calculation result.

The obtained calculation result is sent from computer 102 to outputter 103 (S105) and displayed on display monitor 107 (S106). In addition, at the same time, it is sent from outputter 103 to database 106 on the cloud and stored (S107).

(Electric Field Sensor Example 1)

Figure 4:
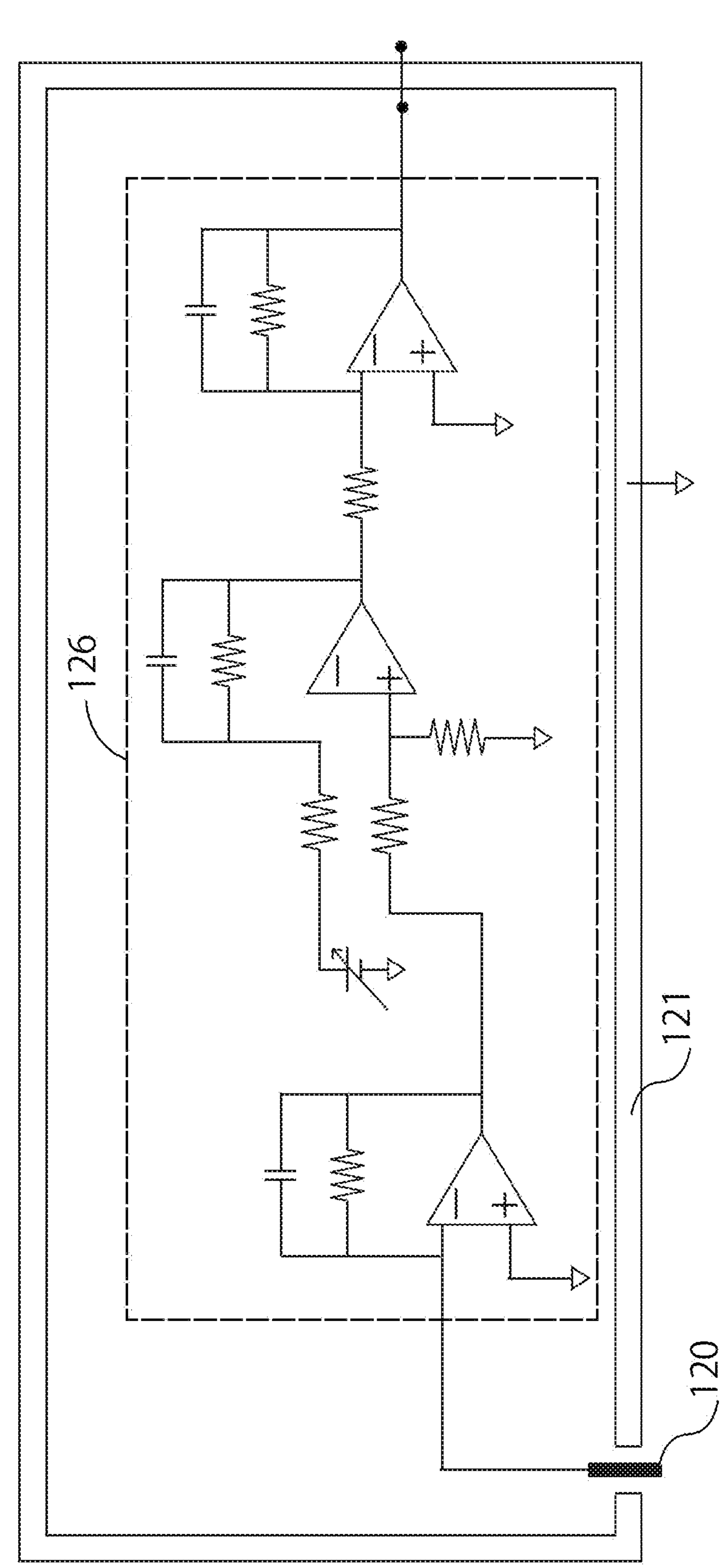
FIG. 4 is a conceptual diagram showing Example 1 of an electric field obtainer according to the embodiment.

An example of single electric field sensor 113 included in electric field obtainer 112 is shown in FIG. 4. Single electric field sensor 113 includes a hole passing through the inside and outside of metal case 121 at one place in hollow metal case 121, and plate-like metal structure 120 is located inside the hole. Metal case 121 is electrically grounded, and metal structure 120 is connected to preamplifier 126 (current-voltage converter, differential amplifier for adjusting and amplifying offset voltage, and amplifier for output voltage adjustment) to output a voltage signal corresponding to the electric field. Metal structure 120 may be needle-shaped, spherical, or have another three-dimensional shape. Grounded metal case 121 can prevent the influence of disturbance, and metal structure 120 can obtain a signal corresponding to a stable electric field.

(Electric Field Sensor Example 2)

Figure 5:
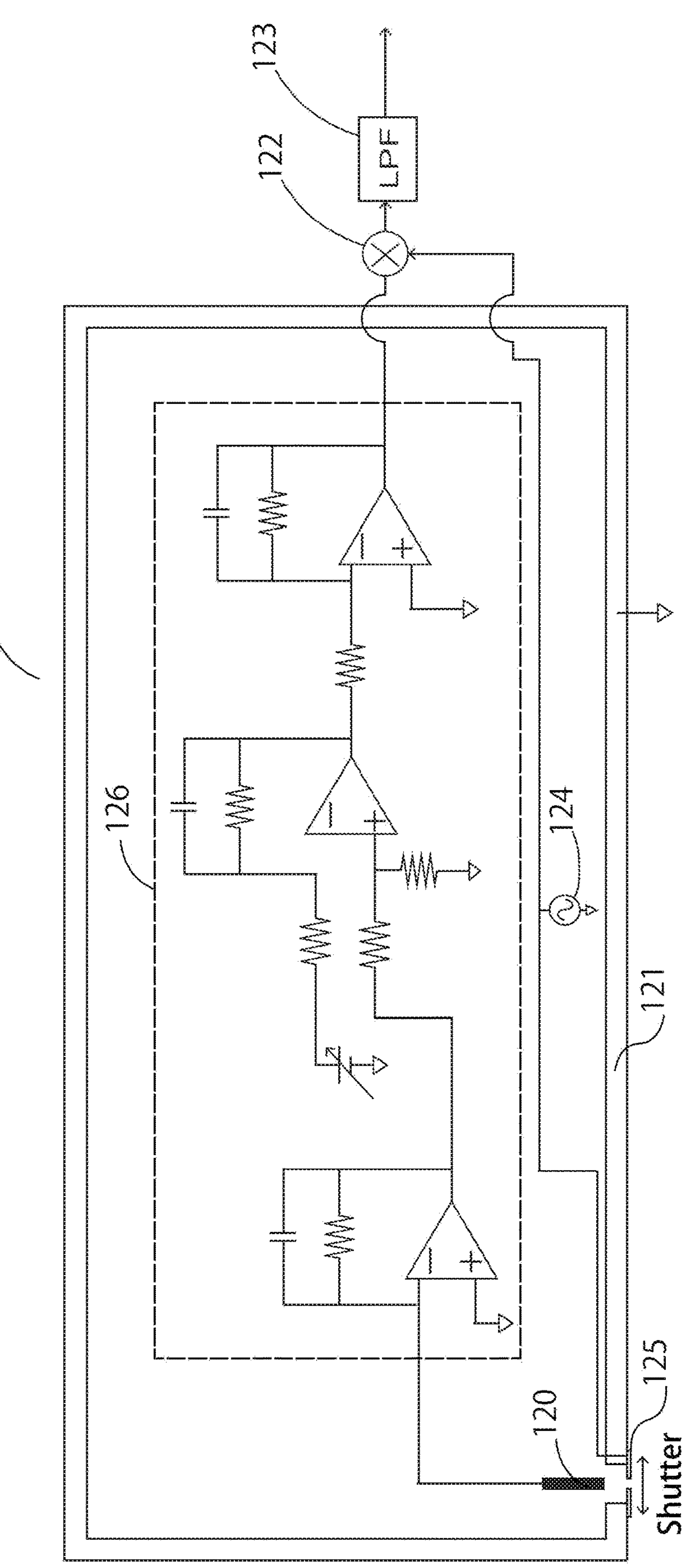
FIG. 5 is a conceptual diagram showing Example 2 of the electric field obtainer according to the embodiment.

Another example of single electric field sensor 113 included in electric field obtainer 112 is shown in FIG. 5. Single electric field sensor 113 includes a hole passing through the inside and outside of metal case 121 at one place in hollow metal case 121, and plate-like metal structure 120 is located inside the hole. Metal case 121 is electrically grounded, and metal structure 120 is connected to preamplifier 126 (current-voltage converter, differential amplifier for adjusting and amplifying offset voltage, and amplifier for output voltage adjustment) to output a voltage signal corresponding to the electric field.

A hole provided in metal case 121 includes shutter 125 that electrically controls opening and closing so that an electric field is applied to metal structure 120 only when shutter 125 is open. For example, shutter 125 may be opened and closed alternately with the electrical signal output by oscillator 124. Then, the output of preamplifier 126, which corresponds to the signal of the electric field corresponding to the opening and closing, may be multiplied in mixer 122 by the output obtained as the reference signal from oscillator 124. Then, the low-frequency components of the output of mixer 122 may be detected through low-pass filter (LPF) 123. This makes it possible to obtain a signal with reduced influence of disturbance with high sensitivity. Shutter 125 may include a piezoelectric element, or may be operated by a metal plate that moves on a rail back and forth by a motor.

Metal structure 120 may be needle-shaped, spherical, or have another three-dimensional shape. Grounded metal case 121 can prevent the influence of disturbance, and metal structure 120 can obtain a signal corresponding to a stable electric field.

(Electric Field Sensor Example 3)

Figure 6:
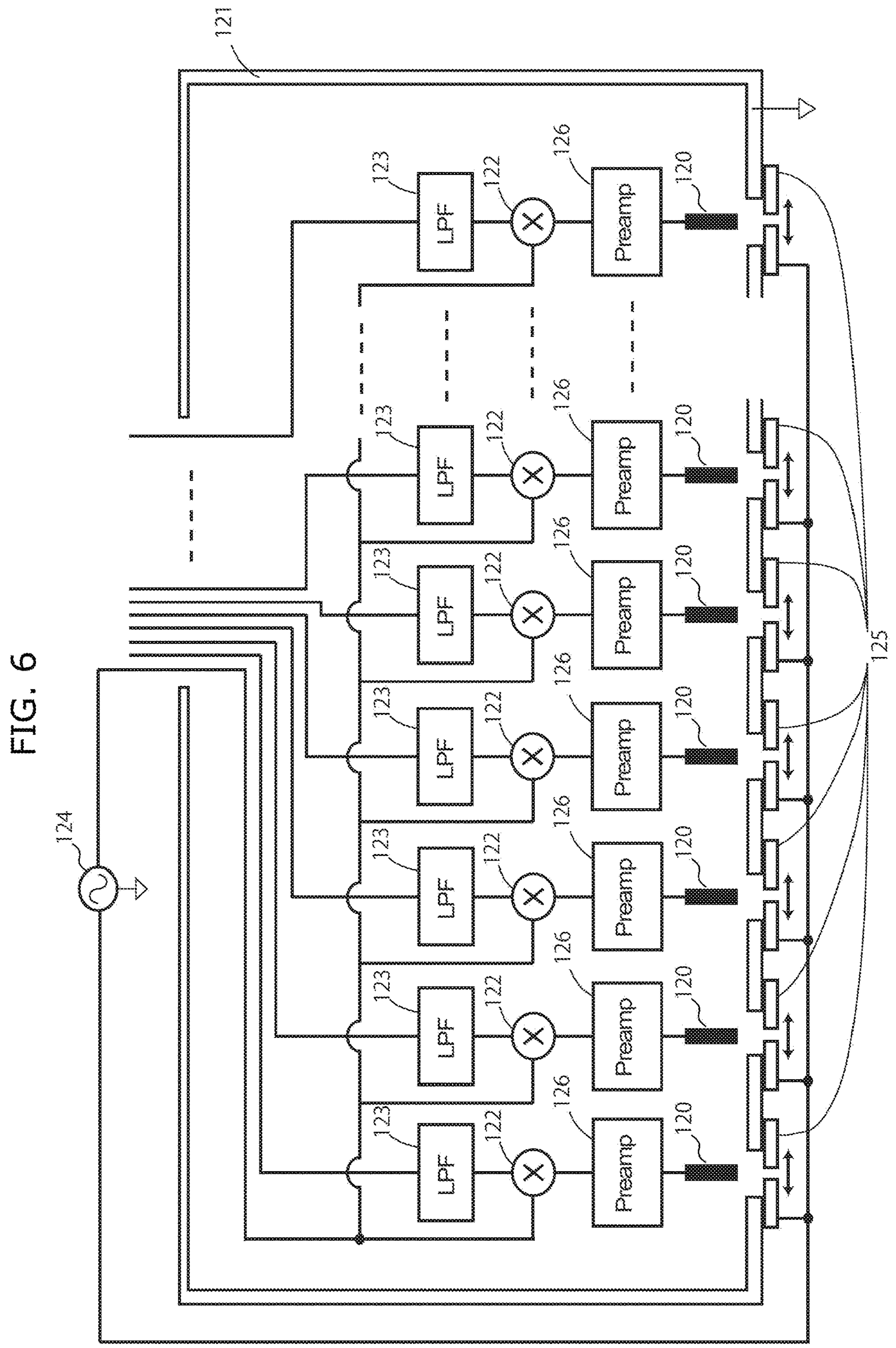
FIG. 6 is a conceptual diagram showing Example 3 of the electric field obtainer according to the embodiment.

An example of a one-dimensional array of single electric field sensors 113 included in electric field obtainer 112 is shown in FIG. 6. A plurality of arrayed single electric field sensors 113 include holes passing through the inside and outside of metal case 121 at a plurality of locations in hollow metal case 121, and a plurality of flat metal structures 120 are located inside the holes. Metal case 121 is electrically grounded, and each metal structure 120 is connected to respective preamplifier 126 (current-voltage converter, differential amplifier for adjusting and amplifying offset voltage, and amplifier for output voltage adjustment) to output a voltage signal corresponding to the electric field.

A plurality of holes provided in metal case 121 include a plurality of shutters 125 that electrically control opening and closing so that an electric field is applied to the plurality of metal structures 120 only when the plurality of shutters 125 are open. For example, a plurality of shutters 125 may be opened and closed alternately synchronously with the electrical signals output by one or more oscillators 124. Then, the outputs of the plurality of preamplifiers 126, which correspond to the signals of the electric fields corresponding to the opening and closing, may be multiplied in a plurality of mixers 122 by the outputs obtained as the reference signals from one or more oscillators 124. Then, the low-frequency components of the outputs of the plurality of mixers 122 may be detected through a plurality of low-pass filters (LPF) 123. This makes it possible to obtain a signal with reduced influence of disturbance with high sensitivity. The plurality of shutters 125 may include a plurality of piezoelectric elements, or may be operated by a plurality of metal plates that move on rails back and forth by motors The plurality of metal structures 120 may be needle-shaped, spherical, or have other three-dimensional shapes. Grounded metal case 121 can prevent the influence of disturbance, and the plurality of metal structures 120 can obtain data corresponding to a stable one-dimensional electric field distribution.

(Electric Field Sensor Example 4)

Figure 7:
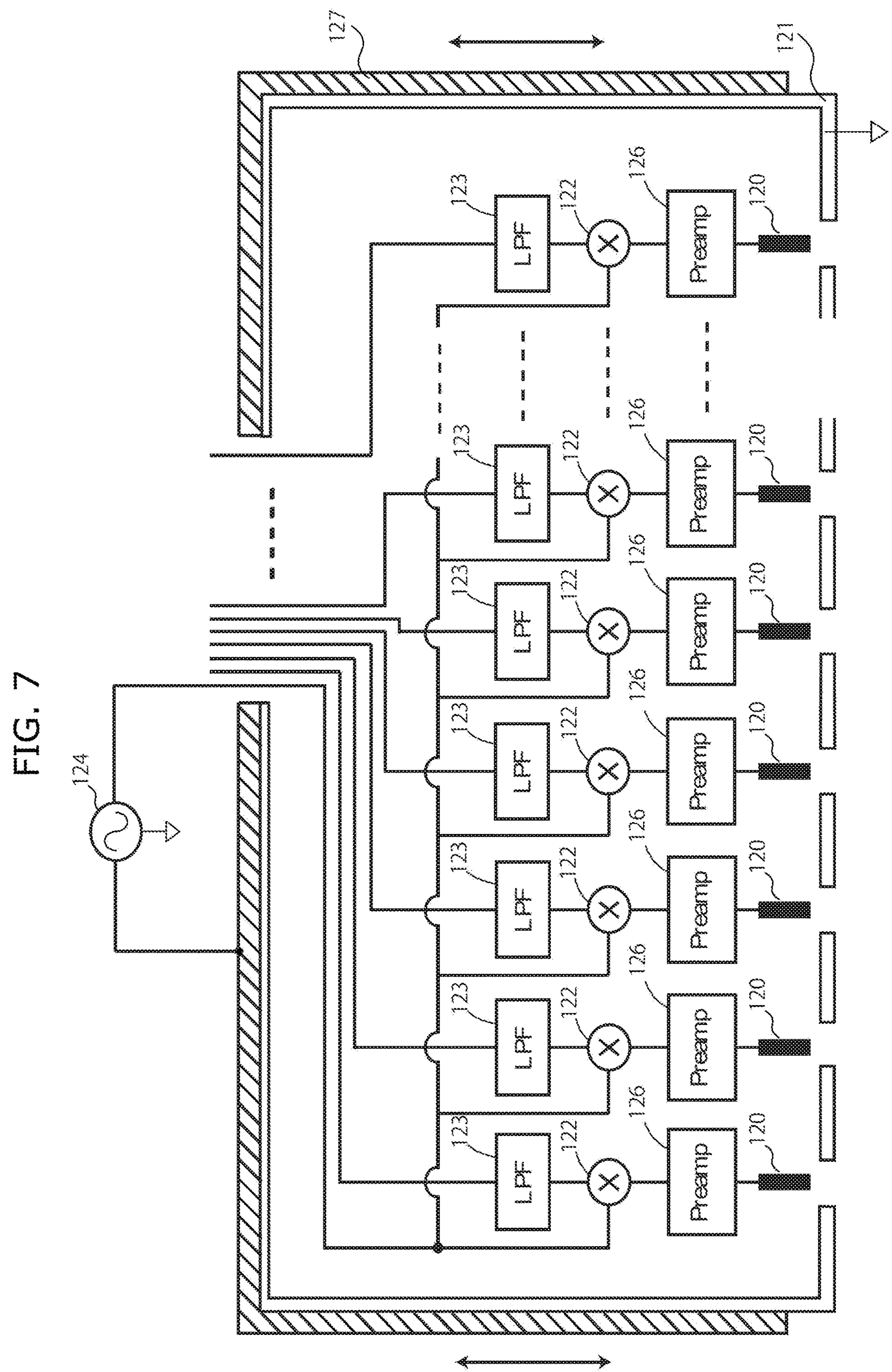
FIG. 7 is a conceptual diagram showing Example 4 of the electric field sensor according to the embodiment.

An example of a one-dimensional array of single electric field sensors 113 included in electric field obtainer 112 is shown in FIG. 7. A plurality of arrayed single electric field sensors 113 include holes passing through the inside and outside of metal case 121 at a plurality of locations in hollow metal case 121, and a plurality of flat metal structures 120 are located inside the holes. Metal case 121 is electrically grounded, and each metal structure 120 is connected to respective preamplifier 126 (current-voltage converter, differential amplifier for adjusting and amplifying offset voltage, and amplifier for output voltage adjustment) to output a voltage signal corresponding to the electric field.

Metal case 121 is placed on vibrator 127 that vibrates in the up-down direction or in the left-right direction, is electrically controlled by oscillator 124, and vibrates alternately. Then, the outputs of the plurality of preamplifiers 126, which correspond to the oscillating signals of the electric fields applied to respective metal structures 120 in accordance with the vibration may be multiplied in a plurality of mixers 122 with the output obtained from one or more oscillators 124 as reference signals. Then, the low-frequency components of the outputs of the plurality of mixers 122 may be detected through a plurality of low-pass filters (LPF) 123. This makes it p possible to obtain a signal corresponding to a one-dimensional electric field distribution with reduced influence of disturbance with high sensitivity. In this case, the component in the up-down direction of the electric field is detected for the vibration in the up-down direction, and the horizontal component of the electric field is detected for the horizontal vibration. Then, using Equation (5), Equation (5a), Equation (9), or Equation (9a) described later, computer 102 calculates the spatial distribution of the component in the up-down direction of the electric field close to wiring 118 to which the voltage is applied in the case of the vibration in the up-down direction, or calculates the electric field distribution of the horizontal component of the electric field close to wiring 118 to which the voltage is applied in the case of the horizontal vibration.

The plurality of metal structures 120 may be needle-shaped, spherical, or have other three-dimensional shapes. Grounded metal case 121 can prevent the influence of disturbance, and the plurality of metal structures 120 can obtain data corresponding to a stable one-dimensional electric field distribution.

(Reconstruction Example 1—One Two-Dimensional Measurement Result)

Figure 9:
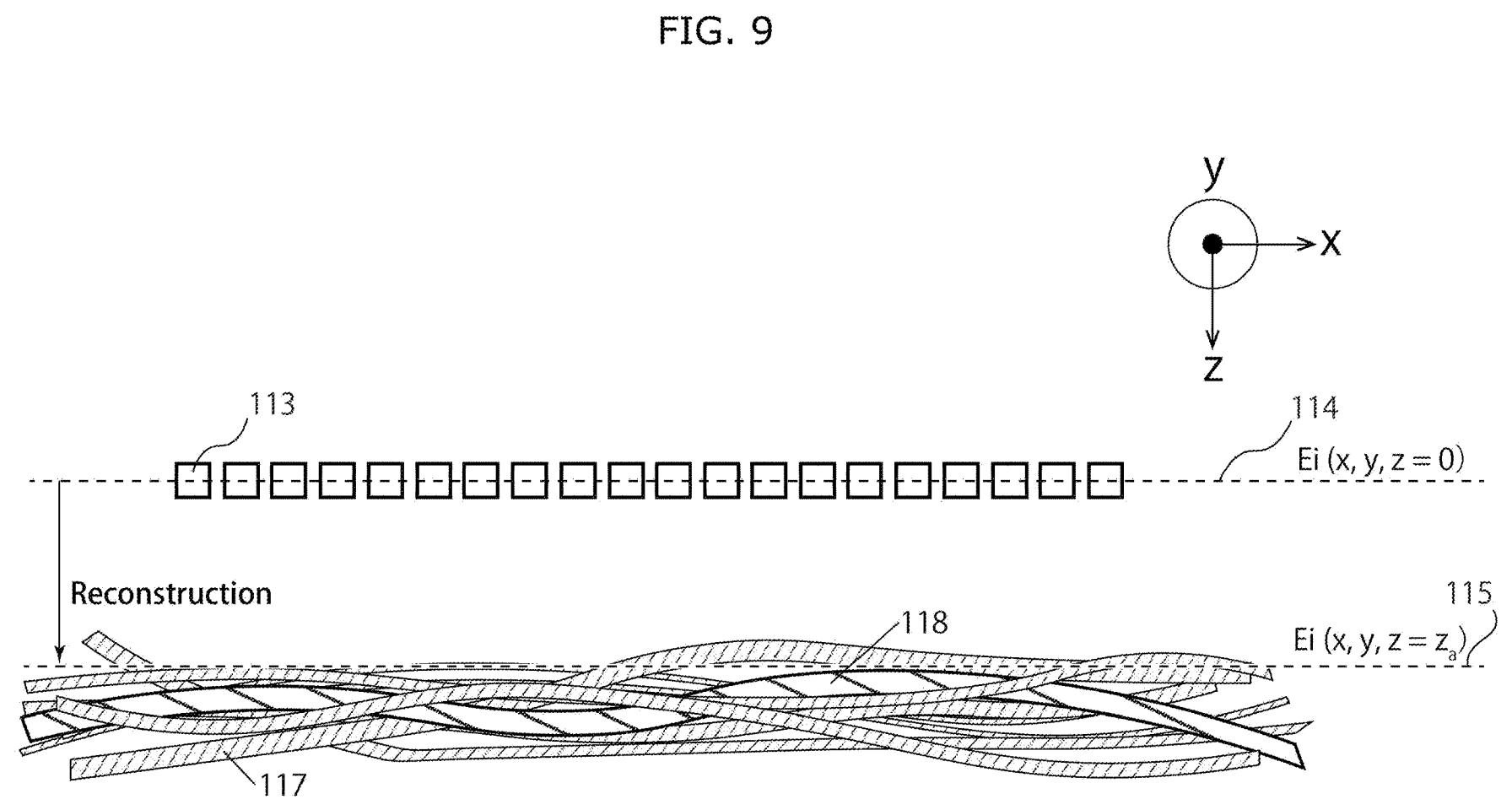

FIG. 9 is a conceptual diagram showing an example of reconstruction in the present embodiment. For example, in the example in FIG. 10, it is possible to scan the two-dimensional measurement surface 114 above wiring 118 to which the voltage is applied by scanner 119 scanning the "single electric field sensors 113 arranged one-dimensionally in a direction orthogonal to the complicatedly tangled wiring" included in electric field obtainer 112 in inspecting system 100. Accordingly, a measurement result of the electric field on the two-dimensional measurement surface 114, that is, a two-dimensional measurement result is obtained.

FIG. 9 expresses measurement surface 114 and reconstruction plane 115 in the xyz orthogonal coordinate system. For example, reconstruction plane 115 may be located in a region closer to the wiring network than measurement surface 114, or may correspond to the surface of the wiring network.

z is a coordinate value in the z-direction from the top of inspecting system 100 toward the bottom where the object to be measured exists, x is a coordinate value in the x-direction orthogonal to the z-direction, and y is a coordinate value in the y-direction orthogonal to the z-direction and x-direction.

For example, the x-direction corresponds to the left-right direction of inspecting system 100, and the y-direction corresponds to the front-back direction of inspecting system 100. Alternatively, the x-direction corresponds to the front-back direction of inspecting system 100 and the y-direction corresponds to the left-right direction of inspecting system 100. In addition, at z=0, the electric field is measured. That is, z=0 corresponds to measurement surface 114.

For example, the basic equations of the stationary electric field and the quasi-stationary electric field in free space "without an electric field source" are expressed by Laplace's equation. Specifically, the following Equation (1) holds for $E_i(x, y, z)$, which is the i component of the electric field vector in the xyz orthogonal coordinate system.

[Math. 2]

$$\Delta E_i = 0 \tag{1}$$

For example, i is x, y, or z. Δ is the Laplacian, also called the Laplacian operator. A general solution of the above Equation (1) is expressed as the following Equation (2) as the sum of an exponentially increasing term and an exponentially decaying term in the z-direction.

[Math. 2]

$$E_i(x, y, z) = \frac{1}{(2\pi)^2}\int\int e^{ik_x x + ik_y y}\left\{a(k_x, k_y)e^{z\sqrt{k_x{}^2+k_y{}^2}} + b(k_x, k_y)e^{-z\sqrt{k_x{}^2+k_y{}^2}}\right\}dk_x dk_y \tag{2}$$

In the above Equation (2), $k_x$ and $k_y$ represent the wave number in the x-direction and the wave number in the y-direction, respectively. In addition, $a(k_x, k_y)$ and $b(k_x, k_y)$ are functions represented by $k_x$ and $k_y$. In the present example, the electric field source is assumed to be on the positive side in the z-direction. Therefore, for convenience, terms that decay exponentially in the z-direction are omitted. Therefore, Equation (2) is expressed as Equation (3) below.

[Math. 3]

$$E_i(x, y, z) = \frac{1}{(2\pi)^2}\int\int e^{ik_x x + ik_y y}\left\{a(k_x, k_y)e^{z\sqrt{k_x{}^2+k_y{}^2}}\right\}dk_x dk_y \tag{3}$$

For example, $E_i(x, y, 0)$, which is the i component of the electric field vector in the z=0 plane, is obtained by the measurement. Using this, $a(k_x, k_y)$ in Equation (3) is calculated as in Equation (4) below.

[Math. 4]

$$a(k_x,k_y)=f(k_x,k_y) \tag{4}$$

Here, $f(k_x, k_y)$ is the two-dimensional Fourier transform image of $E_i(x, y, 0)$. By substituting Equation (4) into Equation (3), $E_i(x, y, z)$ is obtained as in Equation (5) below.

[Math. 5]

$$E_i(x, y, z) = \frac{1}{(2\pi)^2}\int\int e^{ik_x x + ik_y y}\left\{f(k_x, k_y)e^{z\sqrt{k_x{}^2+k_y{}^2}}\right\}dk_x dk_y \tag{5}$$

As described above, Equation (5) representing the electric field (specifically, the i component of the electric field vector) is derived according to the sensing result of the electric field and the basic equations of the stationary electric field and the quasi-stationary electric field.

That is, it is possible to derive the solution of Laplace's equations, which are the basic equations of the stationary electric field and the quasi-stationary electric field in the free space, using $E_i(x, y, 0)$, which is a Dirichlet-type boundary condition. Specifically, it is possible to derive $E_i(x, y, z)$ at any z-coordinate in space where no electric field source exists. That is, it is possible to reconstruct the electric field on reconstruction plane 115 near wiring 118 to which the voltage is applied from the electric field on measurement surface 114 which is the xy plane of z=0.

For example, $E_i(x, y, 0)$ is obtained as the sensing result on measurement surface 114 at z=0. Then, $f(k_x, k_y)$ is obtained by performing a two-dimensional Fourier transform on x and y for $E_i(x, y, 0)$ obtained from the sensing result. Then, by substituting $f(k_x, k_y)$ obtained by the two-dimensional Fourier transform and z-coordinate value $z_a$ of reconstruction plane 115 into Equation (5), $E_i(x, y, z_a)$ on reconstruction plane 115 are obtained. This makes it possible to accurately obtain information on the electric field on reconstruction plane 115.

Ultimately, $E_i(x, y, z_a)$ on reconstruction plane 115 is expressed as Equation (6) below.

[Math. 6]

$$E_i(x, y, z_a) = \frac{1}{(2\pi)^2}\int\int e^{ik_x x + ik_y y}\left\{f(k_x, k_y)e^{z_a\sqrt{k_x{}^2+k_y{}^2}}\right\}dk_x dk_y \tag{6}$$

Computer 102 may generate an image expressed by $E_i(x, y, z_a)$ in the above Equation (6) as the image representing the electric field on reconstruction plane 115.

Figure 10:
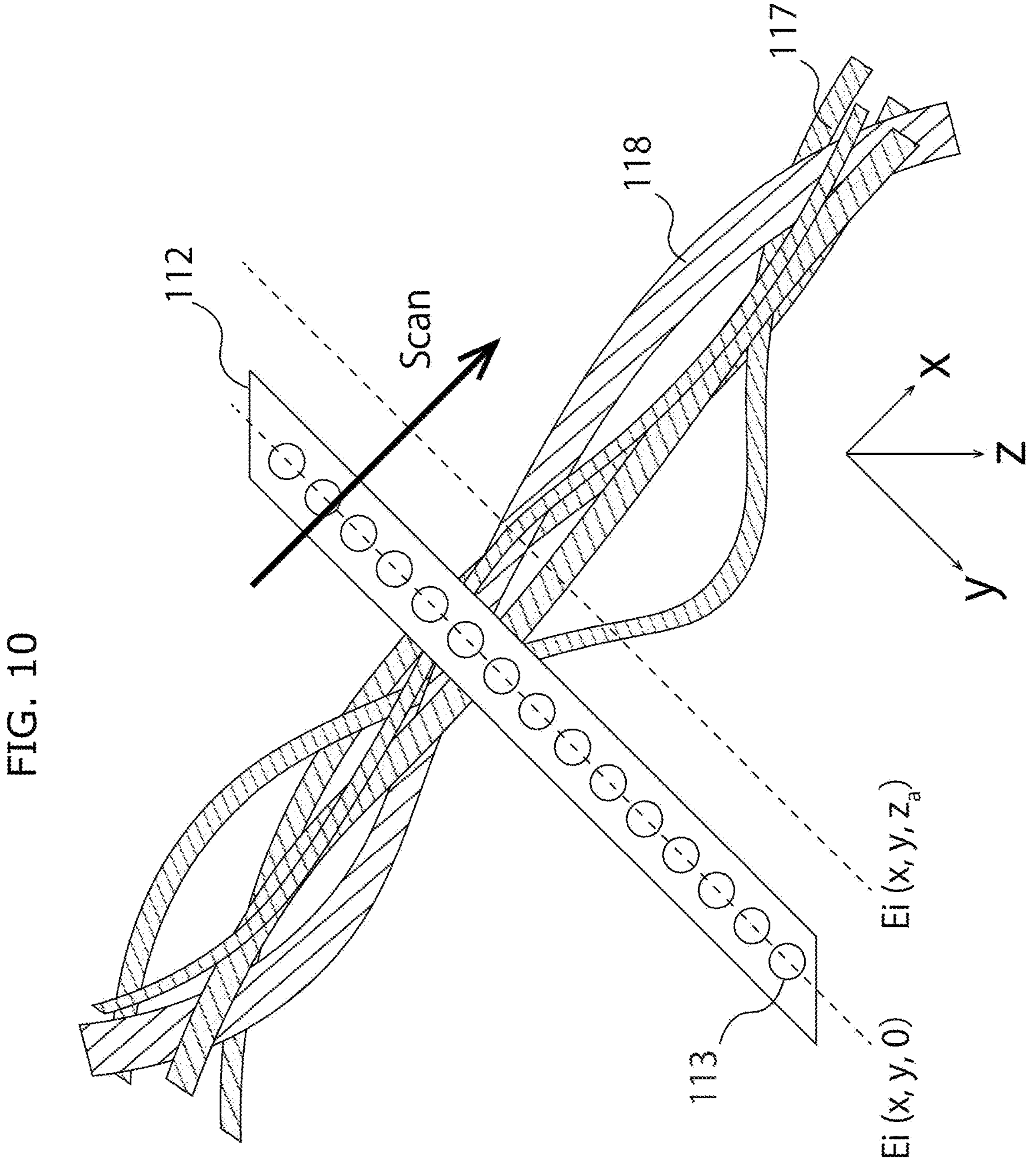
FIG. 10 is a conceptual diagram showing Example 3 of reconstruction according to the embodiment.

Although one measurement surface 114 is used in the example described using FIG. 9 and FIG. 10, two measurement surfaces 114 may be used.

(Reconstruction Example 2—Two Two-Dimensional Measurement Results)

A specific description will be given below with reference to FIG. 8 and FIG. 11.

Figure 11:
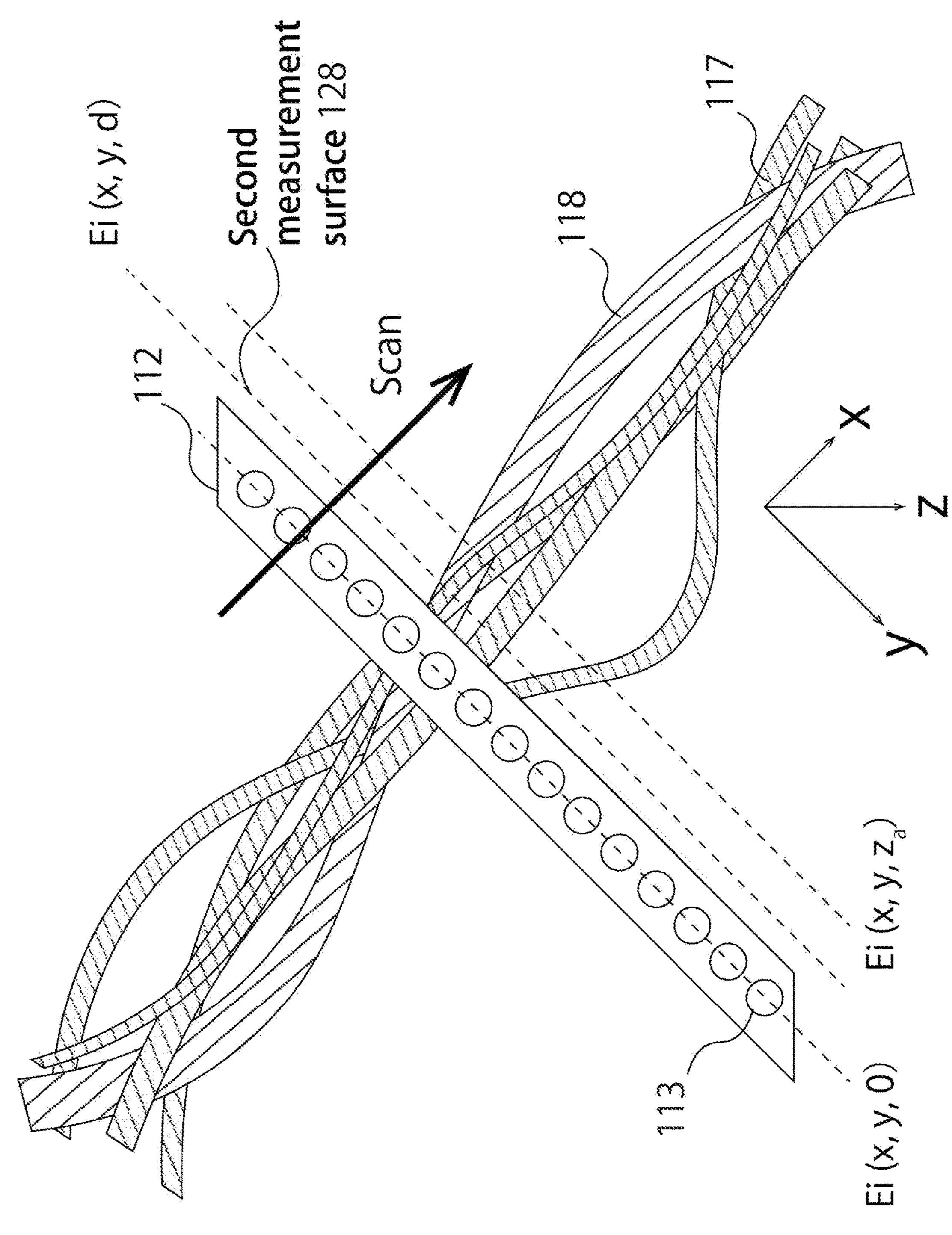
FIG. 11 is a conceptual diagram showing Example 4 of reconstruction according to the embodiment.

FIG. 11 is a conceptual diagram showing one example of electric field obtainer 112 including single electric field sensors 113 shown in FIG. 1. In the present example, single electric field sensors 113 arranged one-dimensionally in the y-direction are scanned in the x-direction, which is the scanning direction, by scanner 119, and a two-dimensional electric field distribution in measurement surface 114 parallel to the complicatedly tangled wiring above the complicatedly tangled wiring can be obtained. Alternatively, scanner 119 may change the position in the z-direction, one-dimensionally scan second measurement surface 128, and obtain two two-dimensional electric field distributions.

Accordingly, measurement results on two planes, measurement surface 114 and second measurement surface 128, are obtained.

FIG. 8 is a conceptual diagram showing the coordinate system for reconstruction shown in FIG. 11. FIG. 8 expresses two measurement surfaces 114, 128 and reconstruction plane 115 in an xyz orthogonal coordinate system. As in the example of FIG. 10, z is the coordinate value in the z-direction from the top of electric field obtainer 112 to the bottom where the complicatedly tangled wiring exist, x is the coordinate value in the x-direction orthogonal to the z-direction, and y is the coordinate value in the y-direction orthogonal to the z-direction and x-direction. In addition, the electric field is sensed at z=0 and z=d. That is, z=0 and z=d correspond to two planes, measurement surface 114 and second measurement surface 128.

In addition, as described above, the above Equation (1) holds for $E_i(x, y, z)$, which is the i component of the electric field vector in the xyz orthogonal coordinate system. In addition, the general solution of the above Equation (1) is expressed as the above Equation (2).

In the present example, it is assumed that the electric field sources exist on both the plus side and the minus side in the z-direction. For example, there may be an electric field source of interest, which is an object to be measured, on the positive side in the z-direction, and an electric field noise source on the negative side in the z-direction. In that reason, terms that decay exponentially in the z-direction are not omitted.

In addition, for example, $E_i(x, y, 0)$, which is the i component of the electric field vector in the plane of z=0, and $\partial/\partial z E_i(x, y, z)|_{z=0}$, which is the gradient of the i component of the electric field vector in the z-direction, are obtained by the measurement. Using these, $a(k_x, k_y)$ and $b(k_x, k_y)$ in Equation (2) are calculated as in Equation (7) and Equation (8) below, respectively.

[Math. 7]

$$a(k_x, k_y) = \frac{1}{2}\left(f(k_x, k_y) + \frac{g(k_x, k_y)}{\sqrt{k_x^2 + k_y^2}}\right) \tag{7}$$

-continued

[Math. 8]

$$b(k_x, k_y) = \frac{1}{2}\left(f(k_x, k_y) - \frac{g(k_x, k_y)}{k_x^2 + k_y^2}\right) \tag{8}$$

In Equation (7) and Equation (8) described above, $f(k_x, k_y)$ is the two-dimensional Fourier transform image of $E_i(x, y, 0)$, and $g(k_x, k_y)$ is the two-dimensional Fourier transform image of $\partial/\partial z E_i(x, y, z)|_{z=0}$. By substituting Equation (7) and Equation (8) into Equation (2), $E_i(x, y, z)$ is obtained as in Equation (9) below.

[Math. 9]

$$E_i(x, y, z) = \frac{1}{(2\pi)^2}\int\int e^{ik_x x + ik_y y}\left\{\frac{1}{2}\left(f(k_x, k_y) + \frac{g(k_x, k_y)}{\sqrt{k_x^2 + k_y^2}}\right)e^{z\sqrt{k_x^2+k_y^2}} + \frac{1}{2}\left(f(k_x, k_y) - \frac{g(k_x, k_y)}{\sqrt{k_x^2 + k_y^2}}\right)e^{-z\sqrt{k_x^2+k_y^2}}\right\}dk_x dk_y \tag{9}$$

As described above, Equation (9) representing the electric field (specifically, the i component of the electric field vector) is derived according to the sensing result of the electric field and the basic equations of the stationary electric field and the quasi-stationary electric field in the free space.

That is, using $E_i(x, y, 0)$, which is the Dirichlet-type boundary condition, and $\partial/\partial z E_i(x, y, z)|_{z=0}$, which is the Neumann-type boundary condition, it is possible to derive the solution of Laplace's equations, which are the basic equations of the steady electric field and the quasi-stationary electric field in the free space. Specifically, it is possible to derive $E_i(x, y, z)$ at any z-coordinate in a space where no electric field source exists. That is, from the electric field on measurement surface 114 which is the xy plane at z=0 and second measurement surface 128 which is the measurement surface in the vicinity thereof, the electric field on reconstruction plane 115 near wiring 118 to which the voltage is applied can be reconstructed.

For example, $E_i(x, y, 0)$ is obtained as the sensing result on measurement surface 114 at z=0. $\partial/\partial z E_i(x, y, z)|_{z=0}$ is calculated according to the sensing results in two planes of measurement surface 114 and second measurement surface 128. For example, the sensing result on measurement surface 114 at z=0 and the sensing result on second measurement surface 128 at z=d are obtained and by dividing their difference by d, which is the distance between measurement surfaces 114, 128, $\partial/\partial z E_i(x, y, z)|_{z=0}$ is approximately obtained.

Then, $E_i(x, y, 0)$ and $\partial/\partial z E_i(x, y, z)|_{z=0}$ obtained from the sensing result are subjected to a two-dimensional Fourier transform with respect to x and y to obtain $f(k_x, k_y)$ and $g(k_x, k_y)$. Then, by substituting $f(k_x, k_y)$ and $g(k_x, k_y)$ obtained by the two-dimensional Fourier transform and z-coordinate value $z_a$ of reconstruction plane 115 into Equation (9), $E_i(x, y, z_a)$ on reconstruction plane 115 is obtained. This makes it possible to accurately obtain information on the electric field on reconstruction plane 115.

Ultimately, $E_i(x, y, z_a)$ on reconstruction plane 115 is expressed as Equation (10) below.

[Math. 10]

$$E_i(x, y, z_a) = \frac{1}{(2\pi)^2}\int\int e^{ik_x x+ik_y y}\left\{\frac{1}{2}\left(f(k_x, k_y) + \frac{g(k_x, k_y)}{\sqrt{k_x^2+k_y^2}}\right)e^{z_a\sqrt{k_x^2+k_y^2}} + \frac{1}{2}\left(f(k_x, k_y) - \frac{g(k_x, k_y)}{\sqrt{k_x^2+k_y^2}}\right)e^{-z_a\sqrt{k_x^2+k_y^2}}\right\}dk_x dk_y \tag{10}$$

Computer 102 may generate an image expressed by $E_i(x, y, z_a)$ in the above Equation (10) as the image representing the electric field on reconstruction plane 115.

(Reconstruction Example 3—One One-Dimensional Measurement Result)

Figure 12:
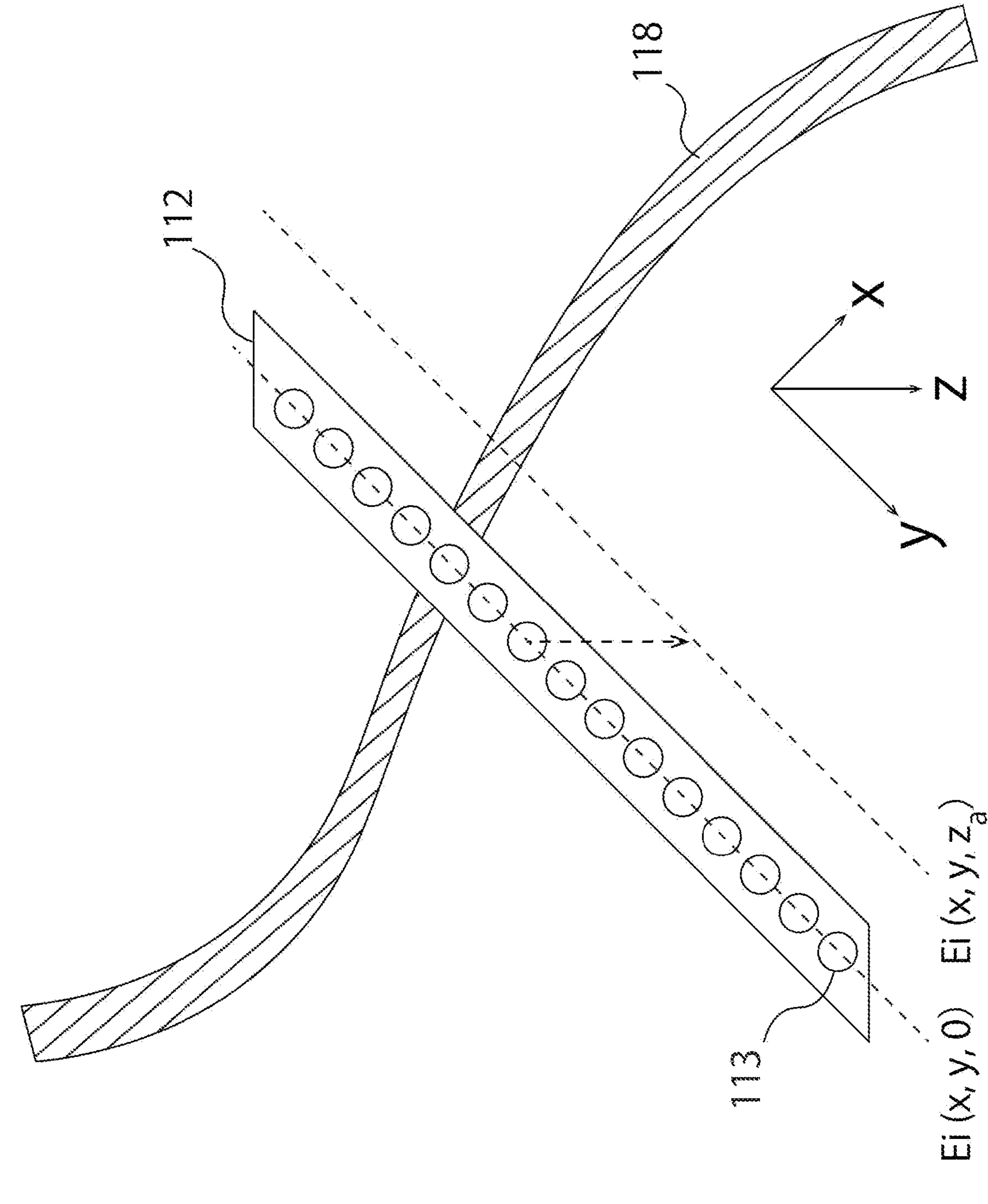
FIG. 12 is a conceptual diagram showing Example 5 of reconstruction according to the embodiment.
Figure 14:
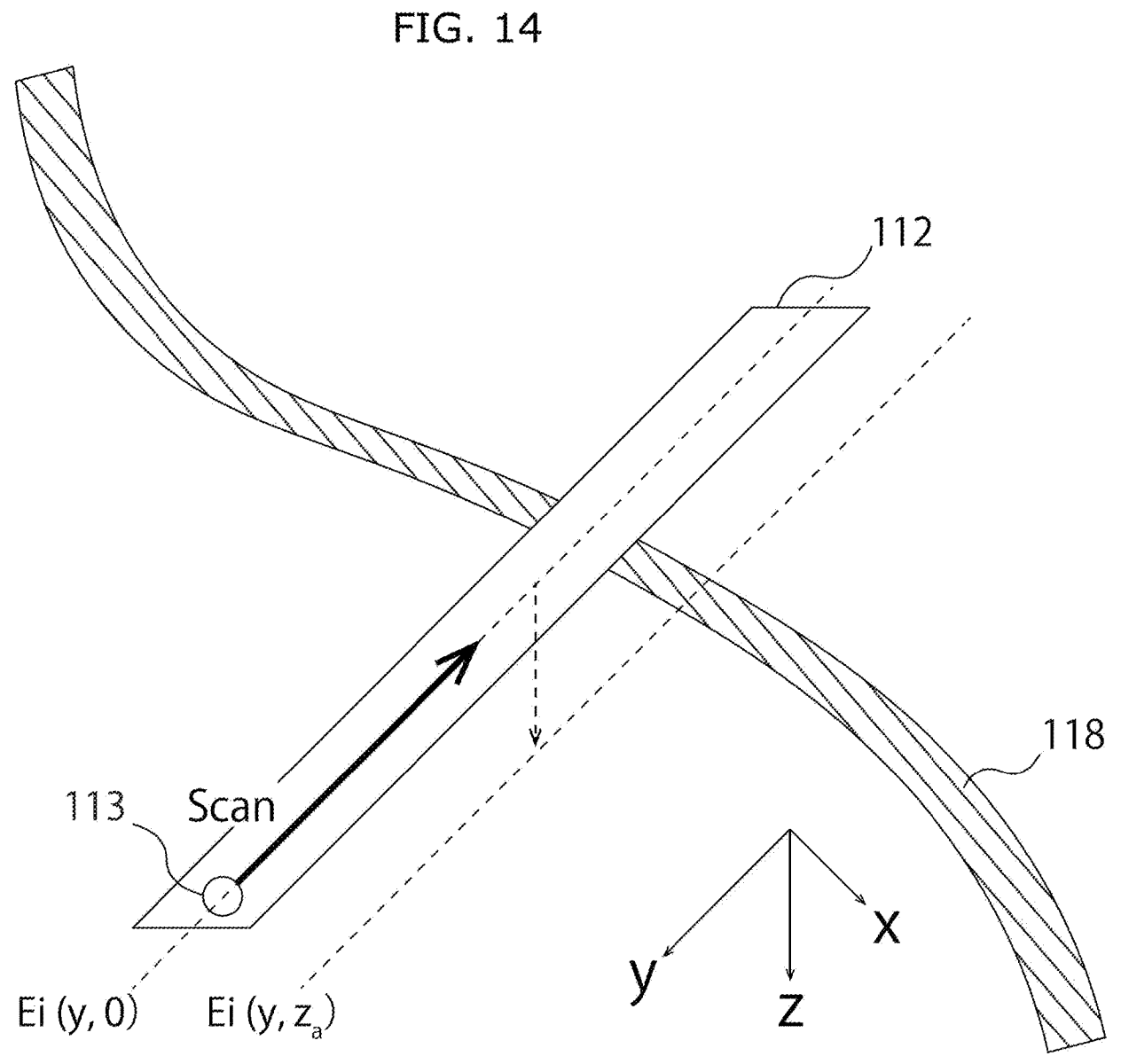

FIG. 12 is a conceptual diagram showing an example of reconstruction in the present embodiment. In the example of FIG. 12, a one-dimensional electric field distribution in two-dimensional measurement surface 114 above wiring 118 to which the voltage is applied can be obtained by single electric field sensors 113 arranged one-dimensionally orthogonal to the complicatedly tangled wiring included in electric field obtainer 112 in inspecting system 100. FIG. 14 shows a case where electric field obtainer 112 includes one single electric field sensor 113 in FIG. 12, and it is possible to obtain a one-dimensional electric field distribution similar to that in FIG. 12 with the scanning by scanner 119.

FIG. 12 also expresses a straight line on measurement surface 114 and a straight line on reconstruction plane 115 in the xyz orthogonal coordinate system.

z is a coordinate value in the z-direction when the direction of a line that intersects the direction of wiring 118 to which a voltage is applied is the z-direction among the normal lines in the direction in which single electric field sensors 113 are arranged one-dimensionally, which are orthogonal to wiring 118 to which the voltage is applied and which are included in electric field obtainer 112 in inspecting system 100, x is a coordinate value in the x-direction orthogonal to the z-direction, and y is a coordinate value in the y-direction orthogonal to the z-direction and the x-direction.

For example, the y-direction corresponds to the one-dimensional array direction of single electric field sensors 113 of inspecting system 100, and the x-direction corresponds to the direction orthogonal thereto. In addition, at z=0, the one-dimensional electric field distribution is measured. That is, x=0 and z=0 corresponds to a straight line on measurement surface 114 from which data is obtained.

Here, if it can be set that there is no change in the object to be measured in the x-direction, the problem is made two-dimensional.

For example, the basic equations of the stationary electric field and the quasi-stationary electric field in free space "without an electric field source" are expressed by the two-dimensional Laplace equation. Specifically, the following Equation (1a) holds for $E_i(y, z)$, which is the i component of the electric field vector in the yz orthogonal coordinate system.

[Math. 11]

$$\Delta E_i = 0 \tag{1a}$$

For example, i is y or z. Δ is the Laplacian, also called the Laplacian operator. A general solution of the above Equation (1a) is expressed as the following Equation (2a) as the sum of an exponentially increasing term and an exponentially decaying term in the z-direction.

[Math. 12]

$$E_i(y, z) = \frac{1}{2\pi}\int e^{ik_y y}\{a(k_y)e^{k_y z} + b(k_y)e^{-k_y z}\}dk_y \tag{2a}$$

In the above Equation (2a), $k_y$ represents the wave number in the y-direction. In addition, $a(k_y)$ and $b(k_y)$ are functions represented by $k_y$. In the present example, the electric field source is assumed to be on the positive side in the z-direction. Therefore, for convenience, terms that decay exponentially in the z-direction are omitted. Therefore, Equation (2a) is expressed as the following Equation (3a).

[Math. 13]

$$E_i(y, z) = \frac{1}{2\pi}\int a(k_y)e^{k_y z}e^{ik_y y}dk_y \tag{3a}$$

For example, $E_i(y,0)$, which is the i component of the electric field vector in the z=0 plane, is obtained by the measurement. Using this, $a(k_y)$ in Equation (3a) is calculated as in Equation (4a) below.

[Math. 14]

$$a(k_y) = f(k_y) \tag{4a}$$

Here, $f(k_y)$ is the one-dimensional Fourier transform data of $E_i(y, 0)$. By substituting Equation (4a) into Equation (3a), $E_i(y, z)$ is obtained as in Equation (5a) below.

[Math. 15]

$$E_i(y, z) = \frac{1}{2\pi}\int f(k_y)e^{k_y z}e^{ik_y y}dk_y \tag{5a}$$

As described above, Equation (5a) representing the electric field (specifically, the i component of the electric field vector) is derived according to the sensing result of the electric field and the basic equations of the stationary electric field and the quasi-stationary electric field.

That is, it is possible to derive the solution of Laplace's equations, which are the basic equations of the stationary electric field and the quasi-stationary electric field in the free space, using $E_i(y, 0)$, which is a Dirichlet-type boundary condition. Specifically, it is possible to derive $E_i(y, z)$ at any z-coordinate in space where no electric field source exists. That is, it is possible to reconstruct the electric field distribution on the straight line on reconstruction plane 115 near wiring 118 to which the voltage is applied from the electric field distribution on the straight line on measurement surface 114 at x=0 and z=0.

For example, $E_i(y, 0)$ is obtained as the sensing result at measurement surface 114 at z=0. Then, $f(k_y)$ is obtained by performing a one-dimensional Fourier transform on y for $E_i(y, 0)$ obtained from the sensing result. Then, by substituting $f(k_y)$ obtained by the one-dimensional Fourier transform and z-coordinate value $z_a$ on the straight line of reconstruction plane 115 into Equation (5a), $E_i(y, z_a)$ on the straight line on reconstruction plane 115 is obtained. This makes it possible to accurately obtain information on the electric field distribution on the straight line on reconstruction plane 115.

Ultimately, $E_i(y, z_a)$ on reconstruction plane 115 is expressed as the following Equation (6a).

[Math. 16]

$$E_i(y, z_a) = \frac{1}{2\pi}\int f(k_y)e^{k_y z_a}e^{ik_y y}dk_y \tag{6a}$$

Computer 102 may generate an image expressed by $E_i(y, z_a)$ in the above Equation (6a) as an image showing the electric field on the straight line on reconstruction plane 115.

In the example described with reference to FIG. 12 and FIG. 14, data on one straight line on one measurement surface 114 is used, but data on two straight lines on two measurement surfaces 114 and 128 may be used.

(Reconstruction 4—Two One-Dimensional Measurement Results)

Figure 15:
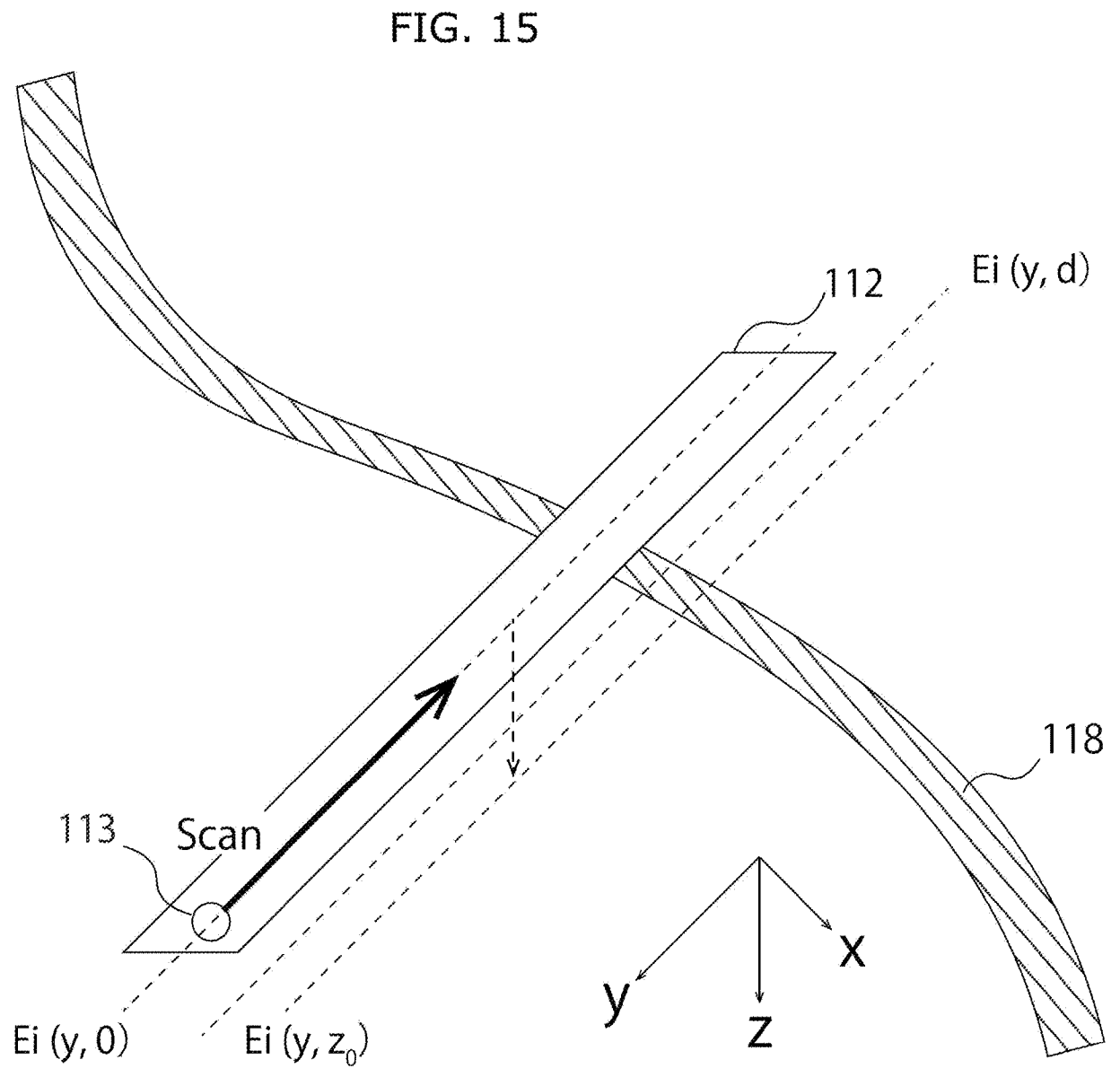

A specific description will be given below with reference to FIG. 13 and FIG. 15.

Figure 13:
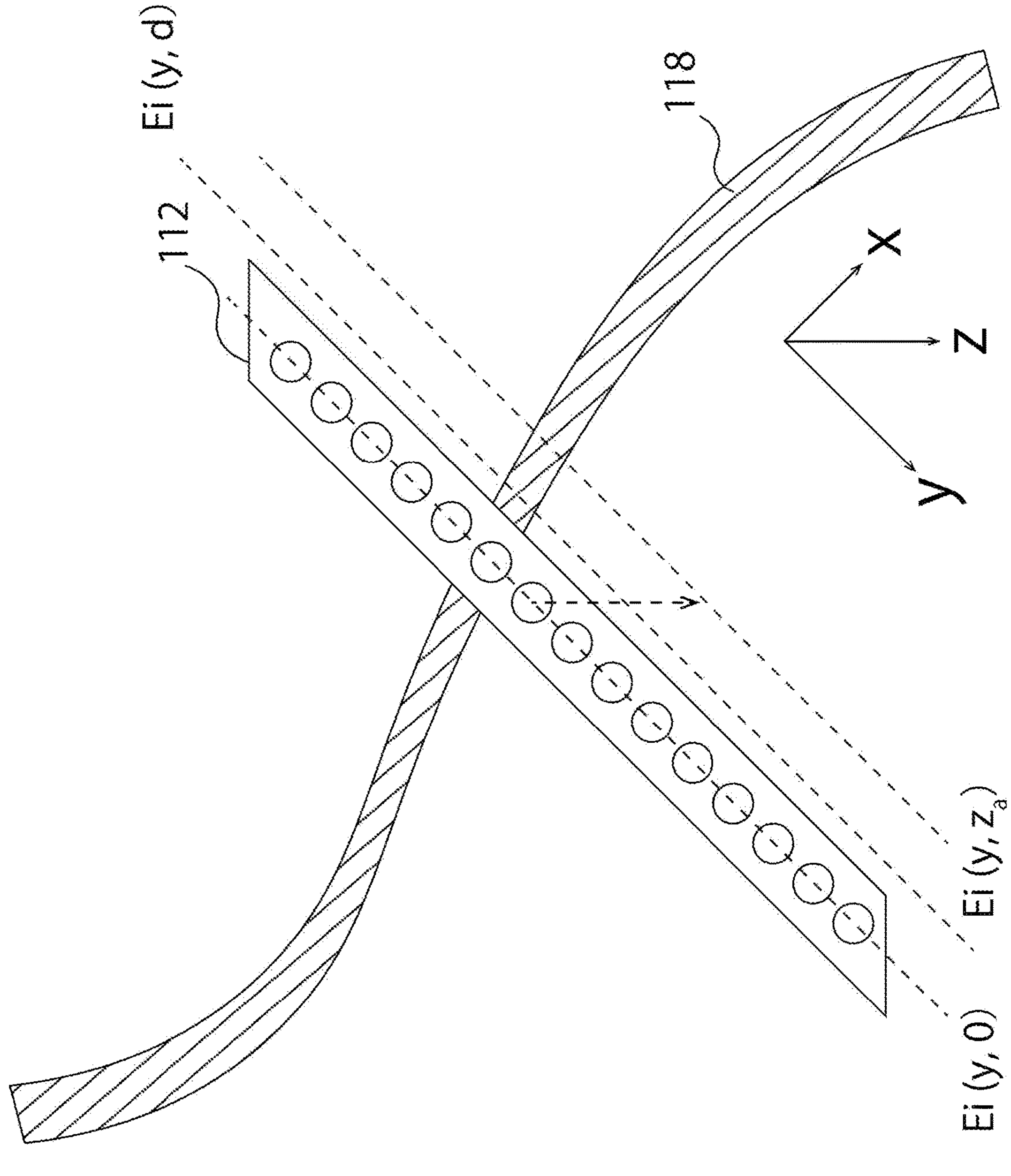
FIG. 13 is a conceptual diagram showing Example 6 of reconstruction according to the embodiment.

FIG. 13 is a conceptual diagram showing one example of electric field obtainer 112 including single electric field sensors 113 shown in FIG. 1. In the present example, single electric field sensors 113 that are one-dimensionally arranged in the y-direction can obtain a one-dimensional electric field distribution on a straight line orthogonal to wiring 118 to which the voltage is applied on measurement surface 114 above wiring 118 to which the voltage is applied. In addition, the position in the z-direction may be changed in scanner 119 and another one-dimensional electric field distribution may be further obtained on a straight line on second measurement surface 128. FIG. 15 shows a case where electric field obtainer 112 includes one single electric field sensor 113 in FIG. 13, and a one-dimensional electric field distribution similar to that in FIG. 13 can be obtained with the scanning by scanner 119.

Accordingly, different measurement results are obtained on the two straight lines on measurement surface 114 and on second measurement surface 128.

Straight lines on measurement surfaces 114 and 128 and a straight line on reconstruction plane 115 for obtaining or reconstructing data in the xyz orthogonal coordinate system are expressed in FIG. 13.

z is a coordinate value in the z-direction when the direction of a line that intersects the direction of wiring 118 to which a voltage is applied is the z-direction among the normal lines in the direction in which single electric field 113 sensors are arranged one-dimensionally, which are orthogonal to wiring 118 to which the voltage is applied and which are included in electric field obtainer 112 in inspecting system 100, x is a coordinate value in the x-direction orthogonal to the z-direction, and y is a coordinate value in the y-direction orthogonal to the z-direction and the x-direction.

For example, the y-direction corresponds to the one-dimensional array direction of single electric field sensors 113 of inspecting system 100, and the x-direction corresponds to the direction orthogonal thereto. In addition, at z=0, the one-dimensional electric field distribution is measured. That is, x=0 and z=0 corresponds to a straight line on measurement surface 114 from which data is obtained.

In addition, as described above, the above Equation (1a) holds for $E_i(x, y, z)$, which is the i component of the electric field vector in the xyz orthogonal coordinate system. In addition, the general solution of the above Equation (1a) is expressed as the above Equation (2a).

In the present example, it is assumed that the electric field sources exist on both the plus side and the minus side in the z-direction. For example, there may be an electric field source of interest, which is an object to be measured, on the positive side in the z-direction, and an electric field noise source on the negative side in the z-direction. In that reason, terms that decay exponentially in the z-direction are not omitted.

In addition, for example, $E_i(y, 0)$, which is the i component of the electric field vector in the plane of z=0, and $\partial/\partial z E_i(y, z)|_{z=0}$, which is the gradient of the i component of the electric field vector in the z-direction, are obtained by the measurement. Using these, $a(k_y)$ and $b(k_y)$ in Equation (2a) are calculated as in Equation (7a) and Equation (8a) below, respectively.

[Math. 17]

$$a(k_y) = \frac{1}{2}\left(f(k_y) + \frac{g(k_y)}{\sqrt{k_y^2}}\right) \tag{7a}$$

[Math. 18]

$$b(k_y) = \frac{1}{2}\left(f(k_y) - \frac{g(k_y)}{\sqrt{k_y^2}}\right) \tag{8a}$$

In Equation (7a) and Equation (8a) described above, $f(k_y)$ is the one-dimensional Fourier transform image of $E_i(y, 0)$, and $g(k_y)$ is the one-dimensional Fourier transform image of $\partial/\partial z E_i(y, z)|_{z=0}$. By substituting Equation (7a) and Equation (8a) into Equation (2a), $E_i(y, z)$ is obtained as in Equation (9a) below.

[Math. 19]

$$E_i(y, z) = \frac{1}{2\pi}\int e^{ik_y y}\left\{\frac{1}{2}\left(f(k_y) + \frac{g(k_y)}{\sqrt{k_y^2}}\right)e^{z\sqrt{k_y^2}} + \frac{1}{2}\left(f(k_y) - \frac{g(k_y)}{\sqrt{k_y^2}}\right)e^{-z\sqrt{k_y^2}}\right\}dk_y \tag{9a}$$

As described above, Equation (9a) representing the electric field (specifically, the i component of the electric field vector) is derived according to the sensing result of the electric field and the basic equations of the stationary electric field and the quasi-stationary electric field in the free space.

That is, using $E_i(y, 0)$, which is the Dirichlet-type boundary condition, and $\partial/\partial z E_i(y, z)|_{z=0}$, which is the Neumann-type boundary condition, it is possible to derive the solution of Laplace's equations, which are the basic equations of the steady electric field and the quasi-stationary electric field in the free space. Specifically, it is possible to derive $E_i(y, z)$ at any z-coordinate in a space where no electric field source exists. That is, from the straight line (x=0, z=0) on measurement surface 114 and the electric field on the straight line on second measurement surface 128 which is the measurement surface near measurement surface 114, the electric field on the straight line on reconstruction plane 115 near wiring 118 to which the voltage is applied can be reconstructed.

For example, $E_i(y, 0)$ is obtained as the sensing result on measurement surface 114 at z=0. $\partial/\partial z E_i(y, z)|_{z=0}$ is calculated according to the sensing results in two planes of measurement surface 114 and second measurement surface 128. For example, the sensing result on the straight line on measurement surface 114 at z=0 and the sensing result on the straight line on second measurement surface 128 at z=d are obtained and by dividing their difference by d, which is the distance between measurement surfaces 114, 128, $\partial/\partial z E_i(x, y, z)|_{z=0}$ is approximately obtained.

Then, $E_i(y, 0)$ and $\partial/\partial z E_i(y, z)|_{z=0}$ obtained from the sensing result are subjected to a one-dimensional Fourier transform with respect to y to obtain $f(k_y)$ and $g(k_y)$. Then, by substituting $f(k_y)$ and $g(k_y)$ obtained by the one-dimensional Fourier transform and z-coordinate value $z_a$ of reconstruction plane 115 into Equation (9a), $E_i(y, z_a)$ on reconstruction plane 115 is obtained. This makes it possible to accurately obtain information on the electric field on the straight line on reconstruction plane 115.

Ultimately, $E_i(y, z_a)$ on the straight line on reconstruction plane 115 is expressed as Equation (10a) below.

[Math. 20]

$$E_i(y, z_a) = \frac{1}{2\pi}\int e^{ik_y y}\left\{\frac{1}{2}\left(f(k_y) + \frac{g(k_y)}{\sqrt{k_y^2}}\right)e^{z_a\sqrt{k_y^2}} + \frac{1}{2}\left(f(k_y) - \frac{g(k_y)}{\sqrt{k_y^2}}\right)e^{-z_a\sqrt{k_y^2}}\right\}dk_y \tag{10a}$$

Computer 102 may generate an image expressed by $E_i(y, z_a)$ in the above Equation (10a) as data representing the electric field on the straight line on reconstruction plane 115.

Figure 16:
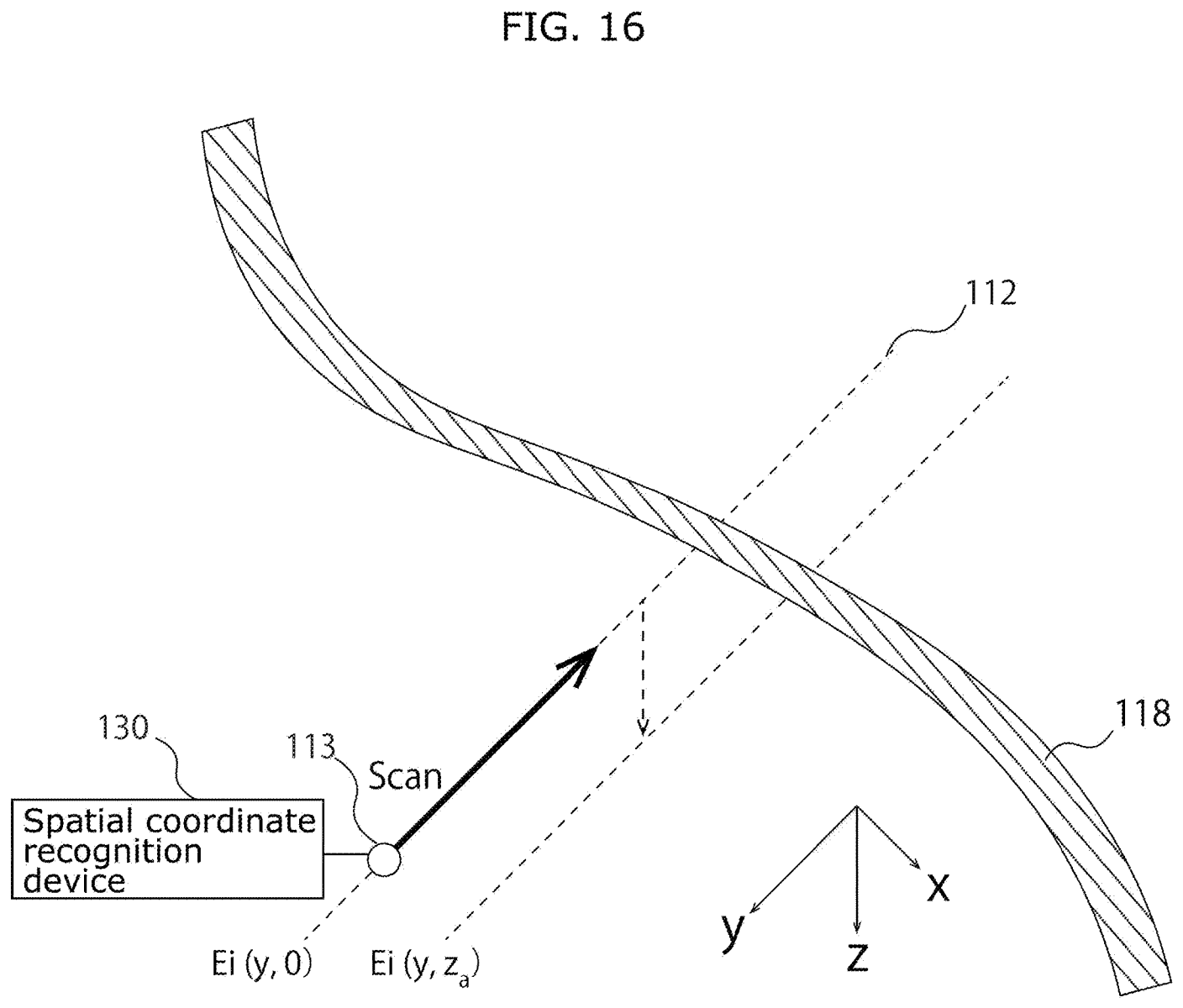
Figure 17:
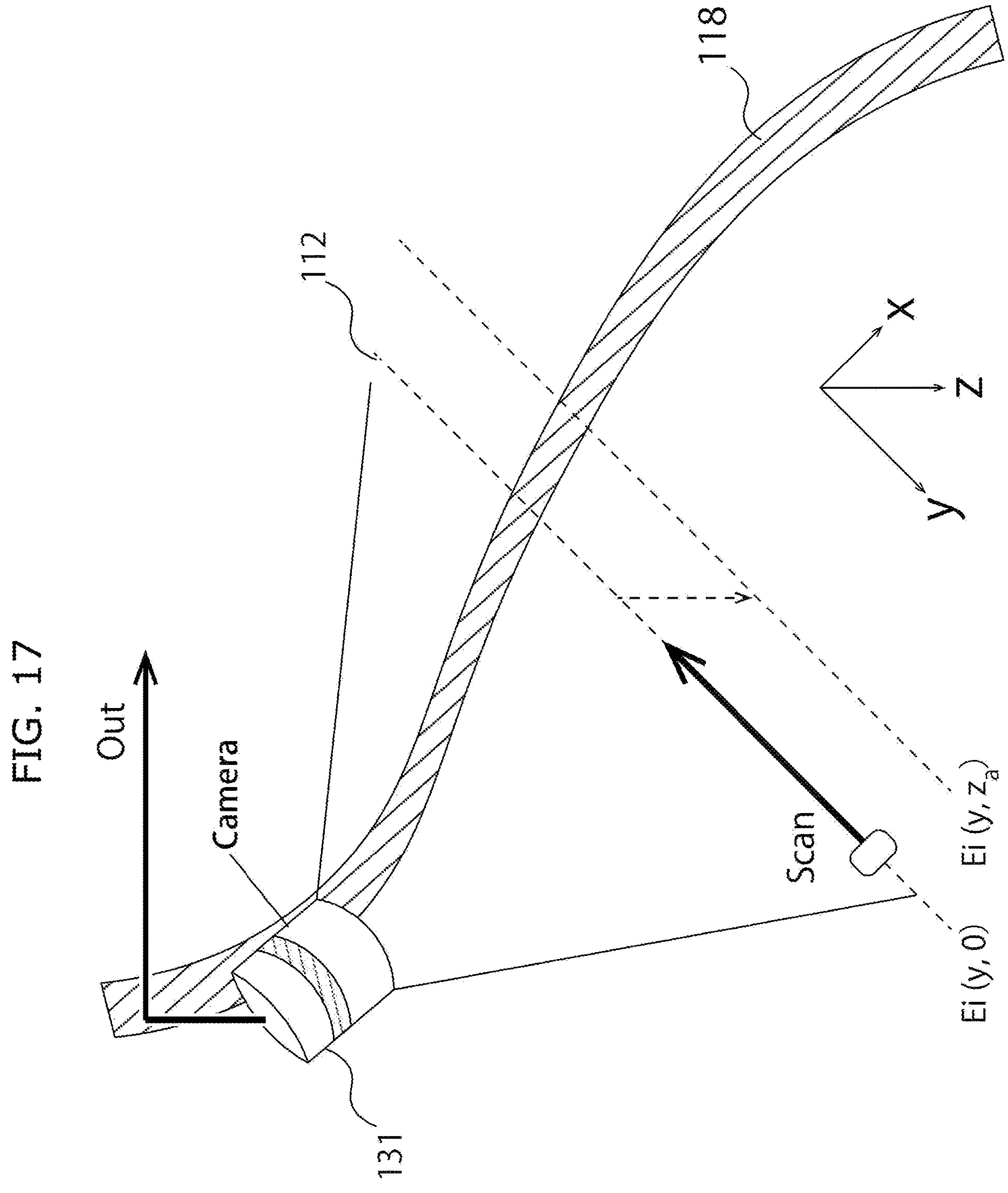
FIG. 17 is a conceptual diagram showing Example 10 of reconstruction according to the embodiment.

FIG. 16 shows an example of another form of inspecting system 100 shown in FIG. 1. The position of electric field obtainer 112 may be recognized by spatial coordinate recognition device 130 to obtain the electric field distribution on the straight line on measurement surface 114. Spatial coordinate recognition device 130 may be, for example, camera 131 as shown in FIG. 17, and from the position of the field of view of camera 131, the position of electric field obtainer 112 may be grasped or the electric field distribution may be obtained. By obtaining the one-dimensional electric field distribution, computer 102 can calculate the one-dimensional electric field distribution in the vicinity of wiring 118 to which the voltage is applied by the above-described Equation (5a) and Equation (9a).

Figure 18:
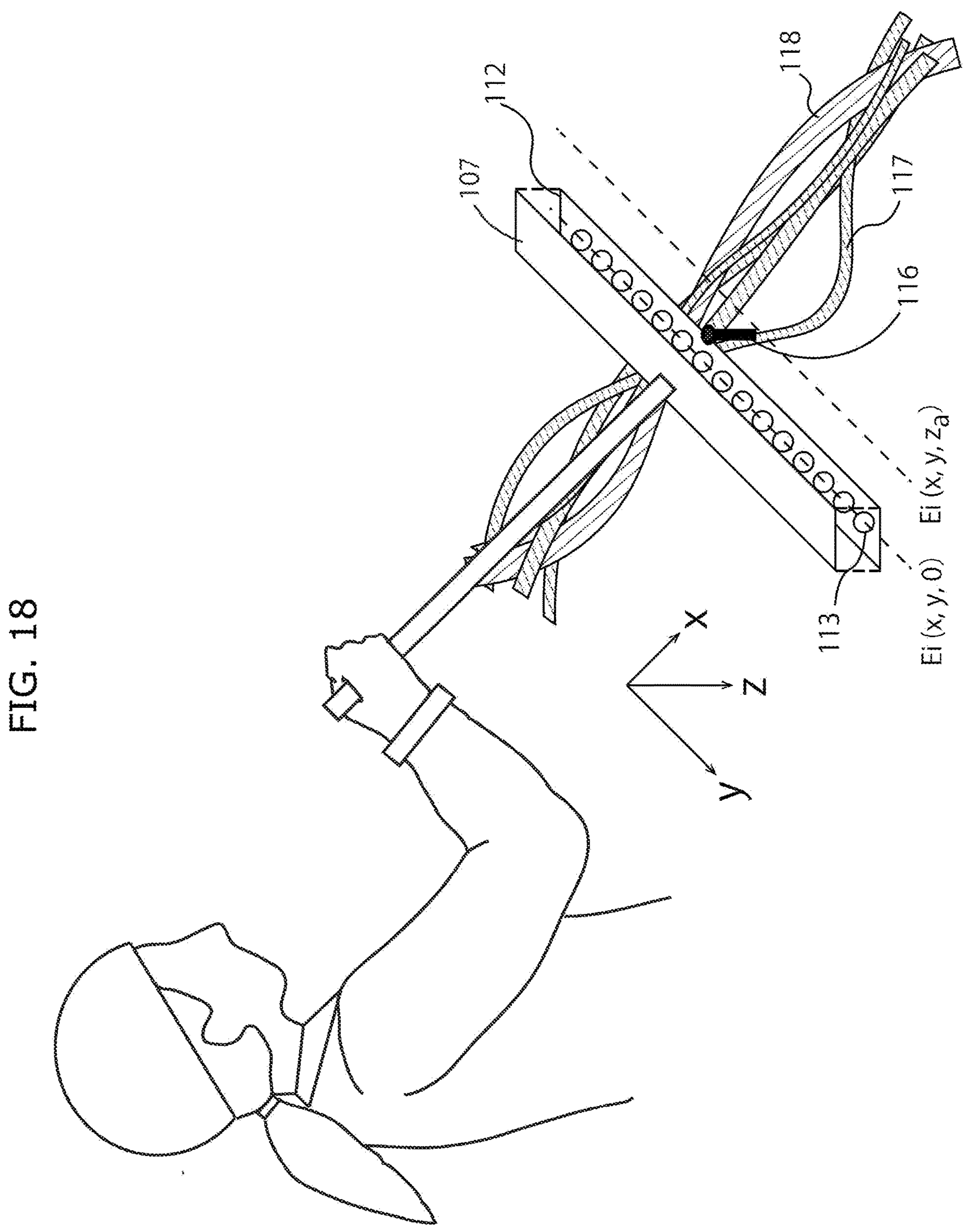
FIG. 18 is a conceptual diagram showing an example of how to use the inspecting system according to the embodiment.

FIG. 18 shows an example of another form of inspecting system 100 shown in FIG. 1. Inspecting system 100 may include a rod held by an operator, single electric field sensors 113 arranged one-dimensionally included in electric field obtainer 112 may be located in the direction orthogonal to wiring 118 to which a voltage is applied in complicatedly tangled wiring, and display monitor 107 including a function as a touch panel may be located on the opposite side of electric field obtainer 112 in inspecting system 100. Accordingly, the operator can easily identify wiring 118 to which the voltage is applied from the complicatedly tangled wiring.

Figure 19:
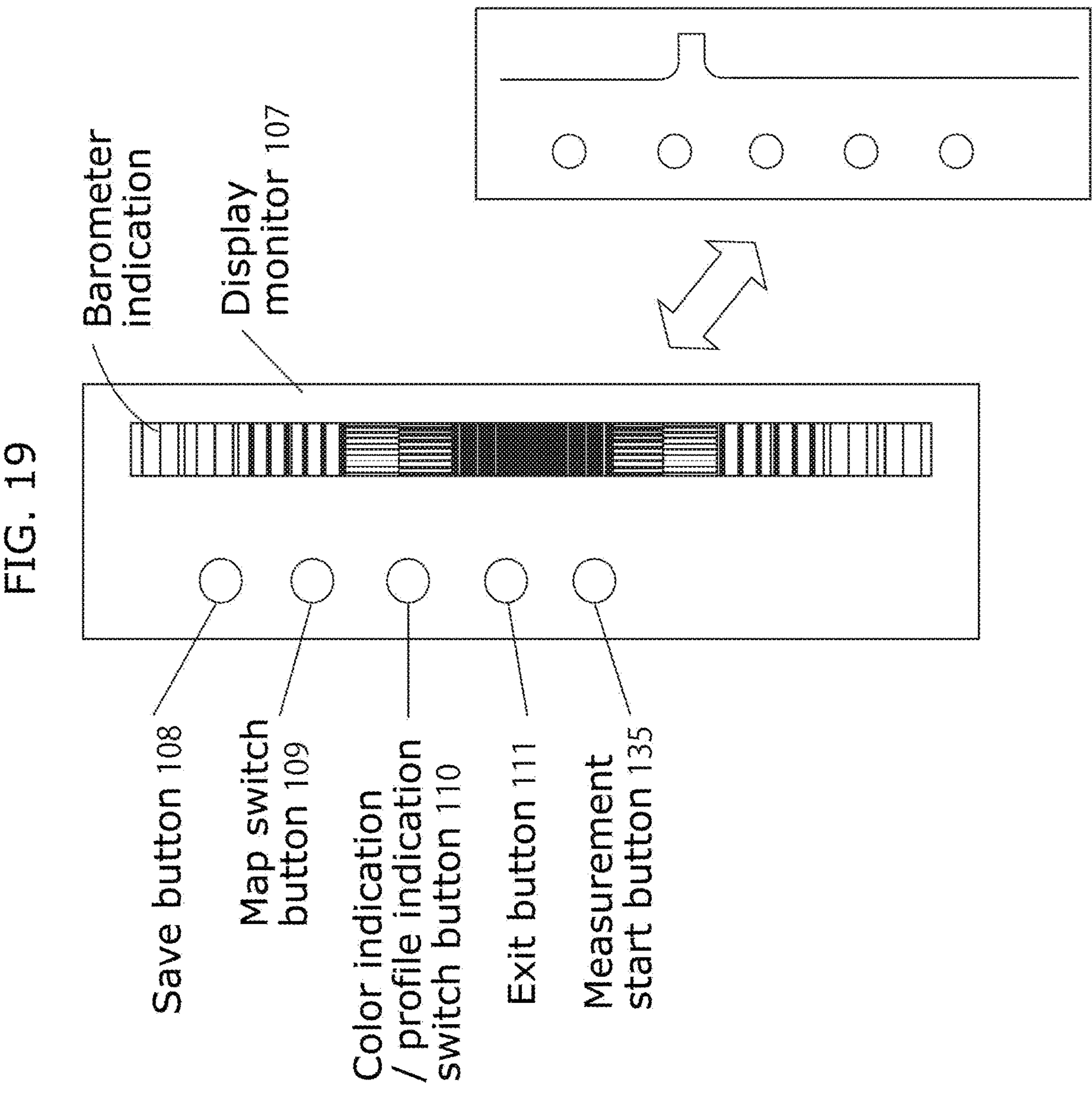
FIG. 19 is a conceptual diagram showing an example of a display monitor according to the embodiment.

FIG. 19 shows an example of the form of the one-dimensional electric field distribution displayed on display monitor 107. In display monitor 107, grids may be arranged one-dimensionally and colors may be distributed according to the electric field intensity. Display monitor 107 may include a function of a touch panel, and may include each button of save button 108, map switching button 109, color indication/profile indication switching button 110, end button 111, and measurement start button 135.

Figure 20:
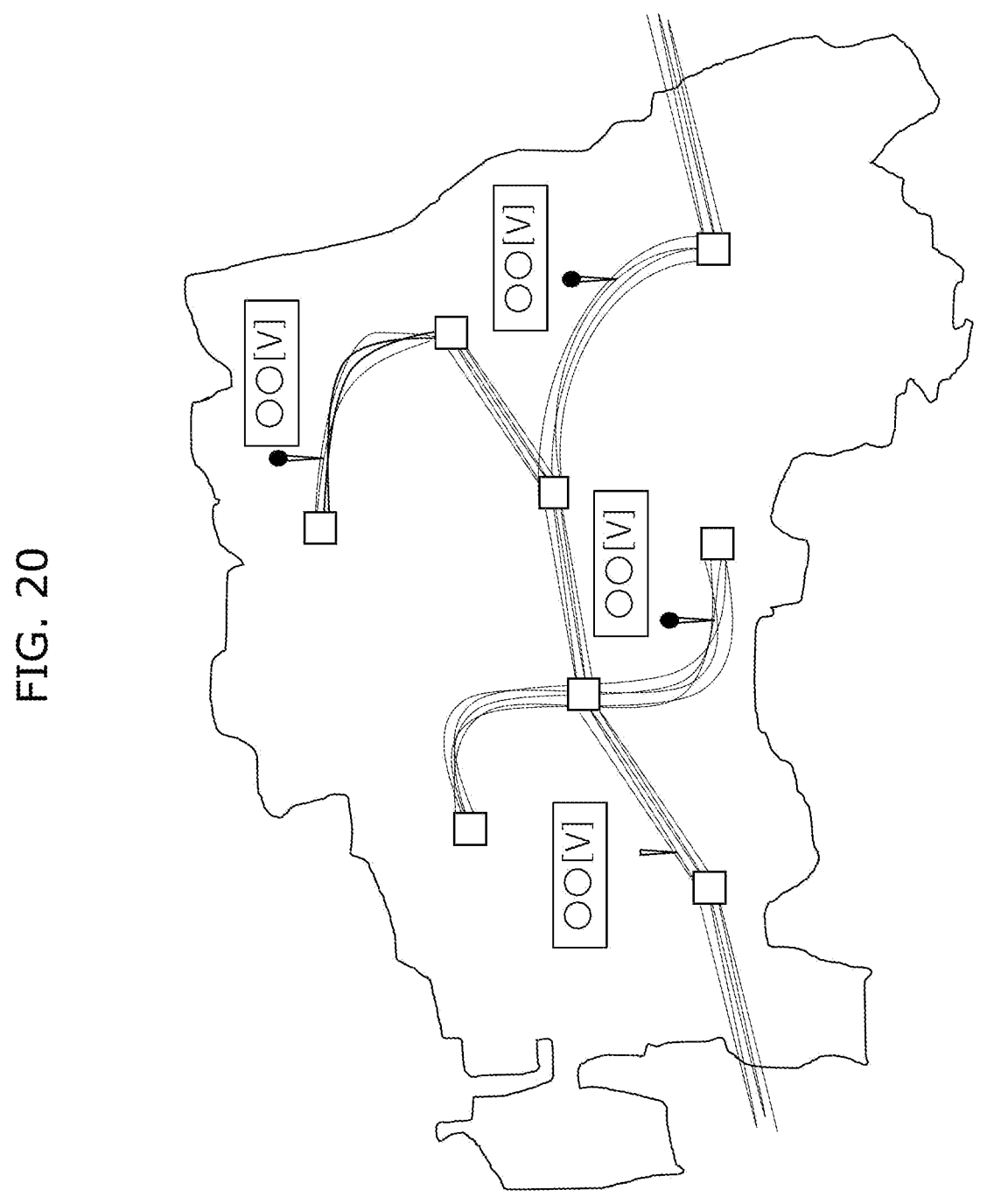

FIG. 20 shows an example of data on the map displayed when map switching button 109 of the buttons displayed on display monitor 107 is pressed. Inspecting system 100 may include a GPS function to display the measured locations on a map, and the electric field intensity values calculated by computer 102 may be displayed. In addition, the displayed value may be ON/OFF of energization.

In addition, each component of inspecting system 100 may include dedicated hardware, may include general-purpose hardware that executes a program for the above processing and the like, or may include a combination thereof. In addition, general-purpose hardware may include a memory in which a program is recorded, a general-purpose processor that reads out and executes the program from the memory, and the like. Here, the memory may be a semiconductor memory, a hard disk, or the like, and the general-purpose processor may be a CPU or the like.

In addition, dedicated hardware may include a memory, a dedicated processor, and the like. For example, a dedicated processor may refer to a memory for recording data and execute the automatic operating control method described above.

In addition, each component of inspecting system 100 may be an electric circuit. These electric circuits may form one electric circuit as a whole, or may be separate electric circuits. In addition, these electric circuits may correspond to dedicated hardware, or may correspond to general-purpose hardware for executing the above-described programs and the like.

In addition, although wiring or a wiring network is shown here as an example of an object that generates an electric field, the object that generates an electric field is not limited to these examples. Various objects such as electronic components, electrical circuits, and electrical equipment can be used as objects that generate electric fields.

INDUSTRIAL APPLICABILITY

One aspect of the present disclosure is useful for an inspecting system that inspects wiring to which a voltage is applied, and is applicable to non-destructive inspection and the like.

REFERENCE SIGNS LIST

100 Inspecting system (inspecting device)
101 Control device
102 Computer (calculator)
103 Outputter
104 Each-unit controller
105 Data recorder
106 Database
107 Display monitor
108 Save button
109 Map switching button
110 Color indication/profile indication switching button
111 End button
112 Electric field obtainer (electric field sensor unit)
113 Single electric field sensor
114, 128 Measurement plane
115 Reconstruction plane
116 Position measurer
117, 118 Wiring
119 Scanner

120 Metal structure
121 Metal case
122 Mixer
123 Low pass filter (LPF)
124 Oscillator
125 Shutter
126 Preamplifier
127 Vibrator
130 Spatial coordinate recognition device
131 Camera
135 Measurement start button

The invention claimed is:

1. An inspecting device that generates a spatial distribution image of an electric field, the inspecting device comprising:

an electric field obtainer that measures a spatial distribution of the electric field at at least one measurement position determined relative to a scanning position, outside an object that emits the electric field;

a scanner that obtains, by scanning the electric field obtainer, a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated, wherein the calculator generates the spatial distribution image according to a following equation:

[Math. 1]

$$E_i(x, y, z) = \frac{1}{(2\pi)^2} \int\int e^{ik_x x + ik_y y} \left\{ f(k_x, k_y) e^{z\sqrt{k_x{}^2 + k_y{}^2}} \right\} dk_x dk_y$$

where $E_i(x, y, z)$ denotes i component of the electric field at coordinate position (x, y, z);

i denotes x, y, or z; z denotes a coordinate value in z-direction from the inspecting device to the object; x denotes a coordinate value in x-direction orthogonal to the z-direction; y denotes a coordinate value in y-direction orthogonal to the z-direction and the x-direction; $f(k_x, k_y)$ denotes a two-dimensional Fourier transform image of $E_i(x, y, 0)$ showing the measurement result of the spatial distribution of the electric field at (x, y, 0) which is a measurement surface; $k_x$ denotes a wave number with respect to x; and $k_y$ denotes a wave number with respect to y.

2. The inspecting device according to claim 1, wherein the calculator calculates a solution of Laplace's equation satisfied by the spatial distribution of the electric field as the spatial distribution of the electric field in the region including the surface of the object using the measurement result of the spatial distribution of the electric field as the boundary condition.

3. The inspecting device according to claim 1, wherein the electric field obtainer includes a two-dimensional electric field sensor array including a plurality of single electric field sensors arrayed in a left-right direction and a front-back direction of the inspecting device.

4. The inspecting device according to claim 1, wherein the electric field obtainer includes a one-dimensional electric field sensor array including a plurality of single electric field sensors arrayed in a left-right direction or a front-back direction of the inspecting device.

5. The inspecting device according to claim 1, wherein the electric field obtainer includes one single electric field sensor.

6. The inspecting device according to claim 1, wherein the scanner obtains measurement results of the spatial distribution of the electric field at the plurality of measurement positions in one layer arrayed in a front-back direction and a left-right direction of the inspecting device.

7. The inspecting device according to claim 1, wherein the scanner obtains measurement results of the spatial distribution of the electric field at the plurality of measurement positions arranged in a front-back direction and a left-right direction of the inspecting device by scanning, in the front-back direction of the inspecting device, the electric field obtainer including a plurality of single electric field sensors arranged in the left-right direction of the inspecting device, or by scanning, in the left-right direction of the inspecting device, the electric field obtainer including a plurality of single electric field sensors arranged in the front-back direction of the inspecting device.

8. The inspecting device according to claim 1, wherein the scanner obtains measurement results of the spatial distribution of the electric field at the plurality of measurement positions arranged in a left-right direction and a front-back direction of the inspecting device by two-dimensionally scanning the electric field obtainer including one single electric field sensor in the left-right direction and the front-back direction of the inspecting device.

9. An inspecting device that generates a spatial distribution image of an electric field, the inspecting device comprising:

an electric field obtainer that measures a spatial distribution of the electric field at at least one measurement position determined relative to a scanning position, outside an object that emits the electric field;

a scanner that obtains, by scanning the electric field obtainer, a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated, wherein the calculator generates the spatial distribution image according to a following equation:

[Math. 2]

$$E_i(y, z) = \frac{1}{2\pi} \int f(k_y) e^{k_y z} e^{ik_y y} dk_y$$

where $E_i(y, z)$ denotes i component of the electric field at coordinate position (y, z); i denotes y or z; z denotes a coordinate value in z-direction from the inspecting device to the object; y denotes a coordinate value in y-direction orthogonal to the z-direction; $f(k_y)$ denotes a one-dimensional Fourier transform image of $E_i(y, 0)$ showing the measurement result of the spatial distribution of the electric field at (0, y, 0) which is a straight line on a measurement surface; and $k_y$ denotes a wave number with respect to y.

10. An inspecting device that generates a spatial distribution image of an electric field, the inspecting device comprising:

an electric field obtainer that measures a spatial distribution of the electric field at at least one measurement position determined relative to a scanning position, outside an object that emits the electric field;

a scanner that obtains, by scanning the electric field obtainer, a measurement result of the spatial distribution of the electric field at a plurality of measurement positions determined relative to a plurality of scanning positions; and a calculator that calculates the spatial distribution of the electric field in a region including a surface of the object using the measurement result of the spatial distribution of the electric field as a boundary condition, and generates the spatial distribution image that shows the spatial distribution that has been calculated, wherein the calculator generates the spatial distribution image according to a following equation:

[Math. 3]

$$E_i(y, z) = \frac{1}{2\pi}\int e^{ik_y y}\left\{\frac{1}{2}\left(f(k_y) + \frac{g(k_y)}{\sqrt{k_y^2}}\right)e^{\sqrt[z]{k_y^2}} + \frac{1}{2}\left(f(k_y) - \frac{g(k_y)}{\sqrt{k_y^2}}\right)e^{-\sqrt[z]{k_y^2}}\right\}dk_y$$

where $E_i(y, z)$ denotes i component of the electric field at coordinate position (y, z); i denotes y or z; z denotes a coordinate value in z-direction from the inspecting device to the object; y denotes a coordinate value in y-direction orthogonal to the z-direction; $f(k_y)$ denotes a one-dimensional Fourier transform image of $E_i(y, 0)$ showing the measurement result of the spatial distribution of the electric field at (0, y, 0) which is a straight line on a measurement surface; $g(k_y)$ denotes a one-dimensional Fourier transform image of $\partial/\partial z E_i(y, z)|_{z=0}$ showing a gradient in z-direction of the measurement result of the spatial distribution of the electric field at (0, y, 0), which is the straight line on the measurement surface; and $k_y$ denotes a wave number with respect to y.

11. An inspecting method for generating a spatial distribution image of an electric field, the inspecting method comprising:

measuring, by an electric field obtainer, a spatial distribution of the electric field at at least one measurement position determined relative to a scanning position, outside an object that emits the electric field;

obtaining, by scanning the electric field obtainer, a measurement result of the spatial distribution of the electric field at a plurality of measurement positions determined relative to a plurality of scanning positions; and calculating the spatial distribution of the electric field in a region including a surface of the object using the measurement result of the spatial distribution of the electric field as a boundary condition, and generating the spatial distribution image that shows the spatial distribution that has been calculated, wherein the spatial distribution image is generated according to a following equation:

[Math. 4]

$$E_i(x, y, z) = \frac{1}{(2\pi)^2}\int\int e^{ik_x x + ik_y y}\left\{\frac{1}{2}\left(f(k_x, k_y) + e^{\sqrt[z]{k_x^2 + k_y^2}}\right\}dk_x dk_y\right.$$

where $E_i(x, y, z)$ denotes i component of the electric field at coordinate position (x, y, z); i denotes x, y, or z; z denotes a coordinate value in z-direction from an inspecting device to the object; the inspecting device comprises the electric field obtainer; x denotes a coordinate value in x-direction orthogonal to the z-direction; y denotes a coordinate value in y-direction orthogonal to the z-direction and the x-direction; $f(k_x, k_y)$ denotes a two-dimensional Fourier transform image of $E_i(x, y, 0)$ showing the measurement result of the spatial distribution of the electric field at (x, y, 0) which is a measurement surface; $k_x$ denotes a wave number with respect to x;

and $k_y$ denotes a wave number with respect to y.

12. An inspecting method for generating a spatial distribution image of an electric field, the inspecting method comprising:

measuring, by an electric field obtainer, a spatial distribution of the electric field at at least one measurement position determined relative to a scanning position, outside an object that emits the electric field;

obtaining, by scanning the electric field obtainer, a measurement result of the spatial distribution of the electric field at a plurality of measurement positions determined relative to a plurality of scanning positions; and calculating the spatial distribution of the electric field in a region including a surface of the object using the measurement result of the spatial distribution of the electric field as a boundary condition, and generating the spatial distribution image that shows the spatial distribution that has been calculated, wherein the spatial distribution image is generated according to a following equation:

$$E_i(y, z) = \frac{1}{2_\pi}\int f(k_y)e^{k_y z}e^{ik_y y}dk_y \quad \text{[Math. 5]}$$

where $E_i(y, z)$ denotes i component of the electric field at coordinate position (y, z); i denotes y or z; z denotes a coordinate value in z-direction from an inspecting device to the object; the inspecting device comprises the electric field obtainer; y denotes a coordinate value in y-direction orthogonal to the z-direction; $f(k_y)$ denotes a one-dimensional Fourier transform image of $E_i(y, 0)$ showing the measurement result of the spatial distribution of the electric field at (0, y, 0) which is a straight line on a measurement surface; and $k_y$ denotes a wave number with respect to y.

13. An inspecting method for generating a spatial distribution image of an electric field, the inspecting method comprising:

measuring, by an electric field obtainer, a spatial distribution of the electric field at at least one measurement position determined relative to a scanning position, outside an object that emits the electric field;

obtaining, by scanning the electric field obtainer, a measurement result of the spatial distribution of the electric field at a plurality of measurement positions determined relative to a plurality of scanning positions; and calculating the spatial distribution of the electric field in a region including a surface of the object using the measurement result of the spatial distribution of the electric field as a boundary condition, and generating the spatial distribution image that shows the spatial distribution that has been calculated, wherein the spatial distribution image is generated according to a following equation:

[Math. 6]

$$E_i(y, z) = \frac{1}{2\pi}\int e^{ik_y y}$$

-continued $$\left\{\frac{1}{2}\left(f(k_y) + \frac{g(k_y)}{\sqrt{k_y^2}}\right)e^{z}\sqrt{k_y^{z}} + \frac{1}{2}\left(f(k_y) - \frac{g(k_y)}{\sqrt{k_y^2}}\right)e^{-z}\sqrt{k_y^2}\right\}dk_y$$

where $E_i(y, z)$ denotes i component of the electric field at coordinate position (y, z); i denotes y or z; z denotes a coordinate value in z-direction from an inspecting device to the object; the inspecting device comprises the electric field obtainer; y denotes a coordinate value in y-direction orthogonal to the z-direction; $f(k_y)$ denotes a one-dimensional Fourier transform image of $E_i(y, 0)$ showing the measurement result of the spatial distribution of the electric field at (0, y, 0) which is a straight line on a measurement surface; $g(k_y)$ denotes a one-dimensional Fourier transform image of $\partial/\partial z E_i(y, z)|_{z=0}$ showing a gradient in z-direction of the measurement result of the spatial distribution of the electric field at (0, y, 0), which is the straight line on the measurement surface; and $k_y$ denotes a wave number with respect to y.

* * * * *